(12) United States Patent
Nishio

(10) Patent No.: US 9,540,526 B2
(45) Date of Patent: Jan. 10, 2017

(54) GAS BARRIER FILM AND METHOD FOR MANUFACTURING GAS BARRIER FILM

(71) Applicant: Konica Minolta, Inc., Chiyoda-ku, Tokyo (JP)

(72) Inventor: Shoji Nishio, Hachioji (JP)

(73) Assignee: KONICA MINOLTA, INC., Tokyo (JP)

( * ) Notice: Subject to any disclaimer, the term of this patent is extended or adjusted under 35 U.S.C. 154(b) by 12 days.

(21) Appl. No.: 14/436,252

(22) PCT Filed: Oct. 15, 2013

(86) PCT No.: PCT/JP2013/077896
§ 371 (c)(1),
(2) Date: Apr. 16, 2015

(87) PCT Pub. No.: WO2014/061627
PCT Pub. Date: Apr. 24, 2014

(65) Prior Publication Data
US 2015/0291813 A1    Oct. 15, 2015

(30) Foreign Application Priority Data

Oct. 19, 2012  (JP) .................................. 2012-231770

(51) Int. Cl.
C09D 7/12       (2006.01)
C23C 16/40      (2006.01)
C23C 16/54      (2006.01)
H01L 51/52      (2006.01)
C23C 14/34      (2006.01)
C23C 16/455     (2006.01)
C23C 16/50      (2006.01)

(52) U.S. Cl.
CPC .............. C09D 7/1216 (2013.01); C23C 14/34 (2013.01); C23C 16/401 (2013.01); C23C 16/455 (2013.01); C23C 16/50 (2013.01); C23C 16/545 (2013.01); H01L 51/5253 (2013.01)

(58) Field of Classification Search
CPC ........ C23C 14/34; C23C 16/50; C23C 16/455; C23C 16/401; C23C 16/545; H01L 51/5253; H05H 1/24; C09D 7/1216
See application file for complete search history.

(56) References Cited

U.S. PATENT DOCUMENTS 5,260,095 A    11/1993   Affinito

FOREIGN PATENT DOCUMENTS

JP    2004314599 A    11/2004
JP    2011073430 A     4/2011
(Continued)

OTHER PUBLICATIONS

International Search Report corresponding to Application No. PCT/JP2013/077896; Date of Mailing: Jan. 21, 2014, with English translation.
(Continued)

Primary Examiner — Jonathan Langman
(74) Attorney, Agent, or Firm — Cantor Colburn LLP

(57) ABSTRACT

A method for providing a gas barrier film with ample gas barrier properties even in a high temperature, which is maintained when the film is bent. The gas barrier film also has excellent resistance to cracking. A gas barrier film, and a method for manufacturing the same is also disclosed.

9 Claims, 8 Drawing Sheets

(56) References Cited

FOREIGN PATENT DOCUMENTS

| JP | 2012081631 A | | 4/2012 | |
|---|---|---|---|---|
| JP | 2012081632 A | | 4/2012 | |
| JP | 2012084306 A | | 4/2012 | |
| JP | WO2014103756 | * | 7/2014 | ............... B32B 9/00 |

OTHER PUBLICATIONS

Taiwanese Office Action corresponding to Application No. 102137497; Date of Mailing: Sep. 4, 2015, with English translation.
International Preliminary Report on Patentability corresponding to Application No. PCT/JP2013/077896; Date of Issuance: Apr. 21, 2015.
Written Opinion of the International Searching Authority corresponding to Application No. PCT/JP2013/077896; Date of Mailing: Jan. 21, 2014, with English translation.
Chinese Notification of the First Office Action corresponding to Application No. 20130054446.6; Issued Date: Jan. 14, 2016, with English translation.

* cited by examiner

GAS BARRIER FILM AND METHOD FOR MANUFACTURING GAS BARRIER FILM

CROSS REFERENCE TO RELATED APPLICATIONS

This is the U.S. national stage of application No. PCT/JP2013/077896, filed on Oct. 15, 2013. Priority under 35 U.S.C. §119 (a) and 35 U.S.C. §365(b) is claimed from Japanese Application No. 2012-231770, filed Oct. 19, 2012, the disclosure of which is also incorporated herein by reference.

TECHNICAL FIELD

The present invention relates to a gas barrier film and a method for manufacturing a gas barrier film. More specifically, the present invention relates to a flexible transparent gas barrier film and a method for manufacturing the gas barrier film, which can be used for gas blocking in electronic devices, such as liquid crystal displays, organic electroluminescence elements, photovoltaic cells, or electronic paper.

BACKGROUND ART

A demand for electronic devices having long-term reliability, flexible shapes, and a curved display has been added to the longstanding demands for larger and lighter electronic devices. To meet such demands, film substrates have been used that are composed of transparent plastics instead of glass substrates, which are heavy, fragile, and unsuitable for use on large areas.

Unfortunately, film substrates composed of transparent plastics have inferior gas barrier properties compared to glass substrates.

For example, a substrate having inferior gas barrier properties may allow permeation of water vapor and oxygen, and thus may lead to deterioration in an electronic device, for example.

Typically, a film having gas barrier properties is formed on a film substrate and serves as a gas barrier film. For example, known gas barrier films that serve as wrapping materials for wrapping objects that require a barrier against gases and are provided in liquid crystal displays are formed through vapor deposition of silicon oxide or aluminum oxide on a film substrate.

Unfortunately, the vapor deposition described above leads to a water vapor barrier rate of approximately 1 g/m$^2$·24 h at most.

Recent development of high definition large displays requires superior gas barrier properties of film substrates. Specifically, the water vapor barrier rate required is approximately 0.1 g/m$^2$·24 h for liquid crystal displays, and approximately 10$^{-6}$ g/m$^2$·24 h for organic electroluminescence elements.

To meet the requirement of a high water vapor barrier rate, gas barrier layers have been disclosed that include a barrier layer formed through polymer multilayering (PML) (for example, refer to PTL 1).

Gas barrier films have been disclosed that can be bent without degradation in gas barrier properties for water vapor and oxygen, as well as barrier properties (for example, refer to PTL 2).

PRIOR ART LITERATURES

Patent Literatures

[PTL 1] U.S. Pat. No. 5,260,095
[PTL 2] Japanese Patent Application Laid-Open Publication No. 2012-084306

If an electronic device including a gas barrier film described above is used under a high-temperature and high-humidity environment, such as outdoors, the gas barrier properties, flexure resistance, and crack resistance of the gas barrier film are insufficient. The recent advancement in technology has led to frequent use of electronic devices including gas barrier films under high-temperature and high-humidity environments. Thus, the gas barrier properties, flexure resistance, and crack resistance of gas barrier films are significantly important under such environments.

The present invention, which has been conceived in light of the problems and issues described above, provides a gas barrier film and a method for manufacturing the gas barrier film, which has satisfactory gas barrier properties, can be bent without degradation of the gas barrier properties, and has high crack resistance in the gas barrier layer even under a high-temperature and high-humidity environment, such as outdoors.

EFFECTS OF THE INVENTION

The means of the present invention described above provide a gas barrier film and a method for manufacturing the gas barrier film, which has satisfactory gas barrier properties, can be bent without degradation of the gas barrier properties, and has high crack resistance in the gas barrier layer even under a high-temperature and high-humidity environment, such as outdoors.

The mechanisms and operation that establish the advantages of the present invention are not clear, but the following inference has been made.

The inventor, who has conducted extensive research to solve the problems described above, has discovered that a gas barrier layer having a gradient in the carbon atom concentration and two or more local extremum points in the carbon distribution curve across the thickness of the gas barrier layer exhibits inferior gas barrier properties when used under a high-temperature and high-humidity environment, such as outdoors, because, for one reason, water molecules enter the gas barrier layer. That is, the water molecules that enter the gas barrier layer form weak hydrogen bonds therein. This causes microcracks in the gas barrier layer, which causes inferior gas barrier properties. In particular, the atmosphere in a high-temperature and high-humidity environment, such as outdoors, contains more water molecules that are more fluid than that in a normal environment. Thus, the water molecules readily enter the gas barrier layer. Many water molecules enter the gas barrier layer through the surface, adjacent to the substrate, of the gas barrier layer. The entering of water molecules can be effectively prevented through an increase in the proportion of the elements blocking the water molecules on the surface, adjacent to the substrate, of the gas barrier layer. The effective prevention of permeation of water molecules into the gas barrier layer is presumed to be accomplished through an increase in the atomic percentage of oxygen on the side of the surface adjacent to the substrate.

Through prevention of the permeation of water molecules, the scission of inorganic bonds in the gas barrier layer due to vaporization of the water molecules under high temperature and low pressure can also be prevented. If water molecules permeate the gas barrier layer, the carbon gradient in the gas barrier layer blocks the water molecules from passing through the gas barrier layer, trapping the water molecules inside the gas barrier layer. These water molecules break the inorganic bonds in the gas barrier layer. An increased atomic percentage of oxygen on the side of the surface adjacent to the substrate can significantly suppress the permeation of water molecules. Thus, the scission of inorganic bonds in the gas barrier layer can be effectively prevented. A significant number of inorganic bonds are broken by the water molecules in the gas barrier layers stored for long periods of time. It is presumed that the suppressed permeation of water molecules could prevent the degradation of the gas barrier properties during long-term storage.

EMBODIMENT TO CARRY OUT THE INVENTION

Figure 1A:
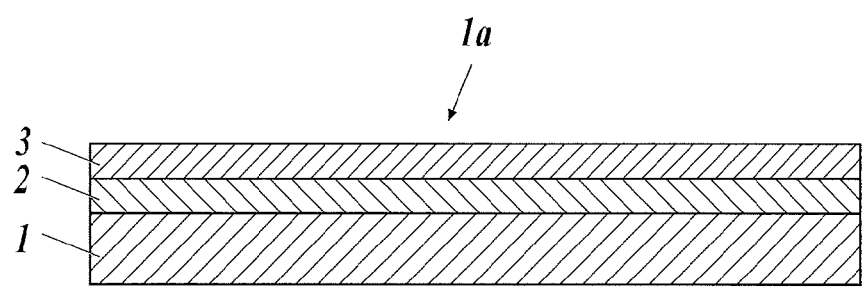
FIG. 1A is a schematic view of the configuration of a gas barrier film.

The gas barrier film according to the present invention has a gas barrier layer containing silicon, oxygen, and carbon on at least one surface of a substrate, and satisfies the following conditions: the proportions of the elements across the depth of the gas barrier layer has a relationship of (atomic percentage of carbon)<(atomic percentage of silicon)<(atomic percentage of oxygen); the atomic percentage of carbon has at least two local extremum points, and the difference between the value of the local maximum point and the value of the local minimum point is 5 at % or more; and the atomic percentage of oxygen of the local maximum point in the gas barrier layer is at a position closest to the substrate.

According to an aspect of the present invention, the atomic percentage of oxygen at a local maximum point of the oxygen distribution curve closest to the surface, adjacent to the substrate, of the gas barrier layer is 1.05 times or more the atomic percentage of oxygen at a local maximum point of the oxygen distribution curve closest to the surface, remote from the substrate, of the gas barrier layer. The gas barrier layer having such a profile is preferred in view of the advantageous effects of the present invention because the layer can block permeation of water molecules and maintain high gas barrier properties when it is bent even after long-time storage. It is preferred that the absolute value of the difference between the maximum value and the minimum value of the atomic percentage of silicon be less than 5 at % and the absolute value of the difference between the distances of adjacent local maximum points of the carbon distribution curve be 200 nm or less, in view of both gas barrier properties and flexure resistance.

According to the present invention, a primary layer comprising polymers containing carbon is disposed between the substrate and the gas barrier layer. The primary layer blocks permeation of water molecules through the substrate and enhances the flexibility of the gas barrier layer and thus enhances both gas barrier properties and flexure resistance.

In a method for manufacturing a gas barrier film according to the present invention, a gas barrier layer is preferably deposited on a substrate through plasma enhanced chemical vapor deposition. Preferably, in the plasma enhanced chemical vapor deposition, the substrate, which is composed of a flexible strip, is conveyed while the substrate is in contact with a pair of deposition rollers, and deposition gas is supplied between the deposition rollers while plasma discharge is performed. Such a process can manufacture a gas barrier layer having an atomic percentage of carbon having at least two local extremum points and a concentration gradient varying continuously. The deposition gas preferably contains organosilicon compounds and oxygen, and the supplied deposition gas contains oxygen in an amount equal to or less than a theoretical amount of oxygen required for complete oxidation of all the organosilicon compound, in view of control of the atomic percentages of silicon and oxygen.

The term "gas barrier properties" in the present invention refers to a water vapor permeability (at a temperature of 60±0.5° C. and a relative humidity (RH) of 90±2%) measured through a procedure in accordance with JIS K 7129-1992 is $3 \times 10^3$ $g/m^2 \cdot 24$ h or less, and the oxygen permeability measured through a procedure in accordance with JIS K 7126-1987 is $1 \times 10^3$ $ml/m^2 \cdot 24$ h·atm or less Components and embodiments of the present invention will now be described in detail. Throughout the specification, the term "to" indicating the numerical range is meant to be inclusive of the boundary values.

<Overview of Gas Barrier Film According to Present Invention>

The gas barrier film according to the present invention includes a gas barrier layer containing silicon, oxygen, and carbon on at least one surface of a substrate, and the distribution curves of these elements obtained through element distribution measurement for the gas barrier layer in the depth direction using X-ray photoelectron spectroscopy satisfy all of Conditions (i) to (iv) described below:

(i) The atomic percentages of silicon, oxygen, and carbon have the relationship indicated below in an area covering 90% or more of the distance from the surface of the gas barrier layer across the thickness:

(atomic percentage of carbon)<(atomic percentage of silicon)<(atomic percentage of oxygen);

(ii) The carbon distribution curve has at least two local extremum points;

(iii) The absolute value of the difference between the maximum value and the minimum value of the atomic percentage of carbon in the carbon distribution curve is 5 at % or more; and (iv) The value of the local maximum point of the oxygen distribution curve closest to the surface, adjacent to the substrate, of the gas barrier layer is the largest of the values of the local maximum points of the oxygen distribution curve of the gas barrier layer.

The distribution curves represent the relationship between the distance from the surface of the gas barrier layer across the depth and the atomic percentage (at %). The proportion of the quantity of silicon atoms to the sum (100 at %) of silicon, oxygen, and carbon atoms is referred to as "atomic percentage of silicon," the proportion of the quantity of oxygen atoms is referred to as "atomic percentage of oxygen," and the proportion of the quantity of carbon atoms is referred to as "atomic percentage of carbon."

The term "sum of silicon, oxygen, and carbon atoms" refers to the total number of silicon, oxygen, and carbon atoms. The terms "quantity of silicon atoms," "quantity of oxygen atoms," and "quantity of carbon atoms" refer to the numbers of silicon atoms, oxygen atoms, and carbon atoms, respectively. The unit is "at % (atomic percent)."

<Configuration of Gas Barrier Film>

The gas barrier film according to the present invention may have any composition. A typical example is illustrated in FIG. 1A. A gas barrier film 1a includes a substrate 1 over which a gas barrier layer 3 is disposed. A smoothing layer 2 is preferably disposed between the substrate 1 and the gas barrier layer 3 so as to reduce the influence of the unevenness of the surface of the substrate on the gas barrier layer, which is a thin film.

Figure 1B:
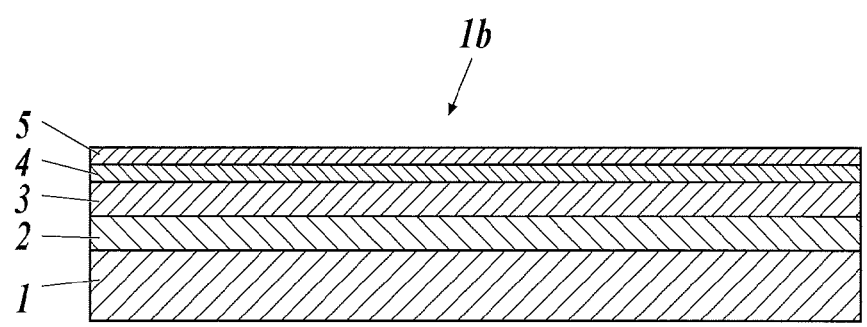
FIG. 1B is a schematic view of the configuration of another gas barrier film.

With reference to FIG. 1B, a gas barrier film 1b according to another embodiment of the present invention, for example, includes a primary layer 2 disposed on a resin substrate 1, a gas barrier layer 3 disposed on the primary layer 2, and a second gas barrier layer 4 containing polysilazane and disposed on the gas barrier layer 3. It is preferred to dispose an overcoat layer 5 on the second gas barrier layer 4.

<Substrate>

Although any substrate can be used for the gas barrier film according to the present invention, a resin substrate composed of organic material that can support the gas barrier layer is preferred for its light weight.

Examples thereof include films of resins, such as methacrylic esters, poly(ethylene terephthalate) (PET), poly(ethylene naphthalate) (PEN), polycarbonates (PC), polyarylates, polystyrene (PS), aromatic polyamides, polyetherether-ketones, polysulfones, polyethersulfones, polyimides, and polyetherimides; and resin films composed of two or more layers of the resins listed above. Poly(ethylene terephthalate) (PET), poly(ethylene naphthalate) (PEN), and polycarbonates (PC) are preferred in view of cost and availability.

The thickness of the resin substrate is preferably within the range of approximately 5 to 500 μm, or more preferably 25 to 250 μm.

The resin substrate according to the present invention is preferably transparent. A transparent gas barrier film can be produced by disposing a transparent layer on a transparent resin substrate. This can be used as a transparent substrate for organic EL elements, for example.

The resin substrate composed of the resins listed above may be an unstretched or stretched film. A stretched film is preferred for high strength and low thermal expansion. Phase differences can also be adjusted through stretching.

The resin substrate according to the present invention can be produced through any known method. For example, an unstretched resin substrate that is substantially amorphous and non-oriented can be produced by melting a material resin in an extruder, extruding the melted resin through a circular or T die, and quenching the resin. Alternatively, an unstretched resin substrate that is substantially amorphous and non-oriented can be produced by dissolving the material resin in a solvent, casting and drying the molten resin on an endless metal support, and separating the dried resin from the support.

A stretched substrate can be produced by stretching the unstretched resin substrate through a known process, such as uniaxial stretching, successive biaxial stretching with a tenter, simultaneous biaxial stretching with a tenter, or simultaneous biaxial stretching of tubular film, in the direction of the flow (longitudinal axis) of the resin substrate and/or a direction orthogonal to the flow of the resin substrate (lateral axis). In such a case, an appropriate stretching ratio can be selected in accordance with the constituent resin of the resin substrate. The stretching ratio in the longitudinal and lateral directions is preferably within the range of 2 to 10.

The resin substrate according to the present invention may be subjected to relaxation processing and offline thermal processing for dimensional stability. The relaxation processing is preferably conducted after thermosetting a polyester film during a stretching step in the film production process and before reeling the polyester film in or downstream of a tenter for lateral stretching of the polyester film. The relaxation process is preferably carried out in a range of 80° C. to 200° C., more preferably, in the range of 100° C. to 180° C. Any scheme of offline thermal processing may be employed. Examples of schemes of offline thermal processing include conveying by a group of rollers, conveying by blowing air against the film and lifting the film (blowing heated air on to one or both sides of the film through multiple slits), using radiant heat from an infrared heater, and hanging the film by its own weight and reeling the film at a low position. Lowering the conveying tension applied during thermal processing as much as possible promotes thermal contraction, which provides a resin substrate having high dimensional stability. The processing temperature is preferably within the range of Tg+50° C. to Tg+150° C., where Tg is the glass-transition temperature (° C.) of the resin.

An undercoating solution can be applied to the resin substrate according to the present invention on one or both sides thereof as an inline process during the film production. The undercoating provided during the film production according to the present invention is referred to as inline undercoating. Any of the following resins can be preferably used as an undercoating solution suitable for the present invention: polyesters, acrylic modified polyester resins, polyurethanes, acrylic resins, vinyl resins, vinylidene chloride resins, polyethylenimine vinylidene resins, polyethylenimine resins, polyvinyl alcohol resins, modified polyvinyl alcohol resins, or gelatin. A known additive may be added to the undercoat layer. The undercoat layer can be applied through a known scheme, such as roll coating, gravure coating, knife coating, dip coating, or spray coating. The preferred quantity of application for the undercoat layer is approximately 0.01 to 2 $g/m^2$ (in a dry state).

<Gas Barrier Layer>

The gas barrier film according to the present invention includes a gas barrier layer containing silicon, oxygen, and carbon on at least one surface of a substrate, and the distribution curves of these elements obtained through element distribution measurement for the gas barrier layer in the depth direction using X-ray photoelectron spectroscopy satisfy all of Conditions (i) to (iv) described below. Such a configuration provides a gas barrier film, which has satisfactory gas barrier properties, can be bent without degradation of the gas barrier properties, and has high crack resistance in the gas barrier layer even under a high-temperature and high-humidity environment, such as outdoors:

(i) The atomic percentages of silicon, oxygen, and carbon have the relationship indicated below in an area covering 90% or more of the distance from the surface across the thickness of the gas barrier layer:

(atomic percentage of carbon)<(atomic percentage of silicon)<(atomic percentage of oxygen);

(ii) The carbon distribution curve has at least two local extremum points;

(iii) The absolute value of the difference between the maximum value and the minimum value of the atomic percentage of carbon in the carbon distribution curve is 5 at % or more; and (iv) The value of the local maximum point of the oxygen distribution curve closest to the surface, adjacent to the substrate, of the gas barrier layer is the largest of the values of the local maximum points of the oxygen distribution curve of the gas barrier layer.

The gas barrier layer according to the present invention is preferably a thin film formed on a substrate through plasma enhanced chemical vapor deposition in which a strip of a flexible resin substrate is conveyed between and in contact with a pair of deposition rollers and is exposed to plasma discharge while deposition gas is supplied between the deposition rollers.

Details of the gas barrier layer according to the present invention will now be described.

<Atomic Percentages and Local Extremum Points of Carbon, Silicon, and Oxygen>

In view of both gas barrier properties and flexure resistance, the gas barrier layer according to the present invention containing carbon, silicon, and oxygen preferably has: (i) atomic percentages of silicon, oxygen, and carbon having the relationship of (atomic percentage of carbon)<(atomic percentage of silicon)<(atomic percentage of oxygen) in 90% or more of the thickness of the gas barrier layer, and an atomic percentage of carbon that has a concentration gradient varying with substantial continuity.

<Definition of Substantial Continuity>

According to the present invention, the carbon distribution curve preferably has substantial continuity.

In this specification, the carbon distribution curve having substantial continuity means the variation in the atomic percentage of carbon in the carbon distribution curve does not include any discontinuity. Specifically, it means the condition represented by the following expression is satisfied by the relationship between the distance x (in nm) from the surface of at least one gas barrier layer in the thickness direction, which is derived from the etching rate and the etching time, and the atomic percentage of carbon C (in at %):

$$(dC/dx) \leq 0.5 \tag{F1}$$

Such a gas barrier layer has: (ii) at least two local extremum points on the carbon distribution curve for the layer, preferably at least three local extremum points. A carbon distribution curve having local extremum points enhances the flexibility of the corresponding gas barrier film such that sufficient gas barrier properties are achieved for a bent film. In a case of at least two or three local extremum points, the absolute value of the difference between the distances, in the thickness direction of the gas barrier layer, of a first local extremum point of the carbon distribution curve and a second local extremum point adjacent to the first local extremum point is preferably 200 nm or less, more preferably 100 nm or less, in view of flexibility involving flexure resistance.

Local extremum points in the present invention refer to local maximum points or local minimum points of the atomic percentage of each element in a certain distance from the surface of the gas barrier layer in the thickness direction of the gas barrier layer.

<Definition of Local Maximum Point and Local Minimum Point>

The local maximum point in the present invention represents a point at which the atomic percentage of the element changes from an increase to a decrease when the distance from the surface of the gas barrier layer varies, and from which point the atomic percentage of the element decreases by 3 at % or more when the distance from the surface of the gas barrier layer in the thickness direction varies by 20 nm.

The local minimum point in the present invention represents a point at which the atomic percentage changes from a decrease to an increase when the distance from the surface of the gas barrier layer varies, and from which point the atomic percentage of the element increases by 3 at % or more when the distance from the surface of the gas barrier layer in the thickness direction varies by 20 nm.

<Relationship Among Average, Maximum Value, and Minimum Value of Atomic Percentage of Carbon>

The average atomic percentage of carbon in the entire gas barrier layer according to the present invention is preferably in the range of 8 to 20 at %, more preferably 10 to 20 at % in view of flexure resistance. An atomic percentage of carbon in the preferred range can provide a gas barrier layer having satisfactory gas barrier properties and flexure resistance.

Such a gas barrier layer preferably has: (iii) the absolute value of the difference of 5 at % or more, more preferably 6 at % or more, most preferably 7 at % or more between the maximum value and the minimum value of the atomic percentage of carbon on the carbon distribution curve. The absolute value of the difference of 3 at % or more can achieve satisfactory gas barrier properties for a bent gas barrier film.

<Positions of Local Extremum Points and Relationship Between Maximum Value and Minimum Value of Atomic Percentage of Oxygen>

According to the present invention, in order to prevent permeation of water molecules from the substrate, (iv) the value of the local maximum point of the oxygen distribution curve closest to the surface, adjacent to the substrate, of the gas barrier layer should be the largest of the values of the local maximum points of the oxygen distribution curve in the gas barrier layer.

Figure 4:
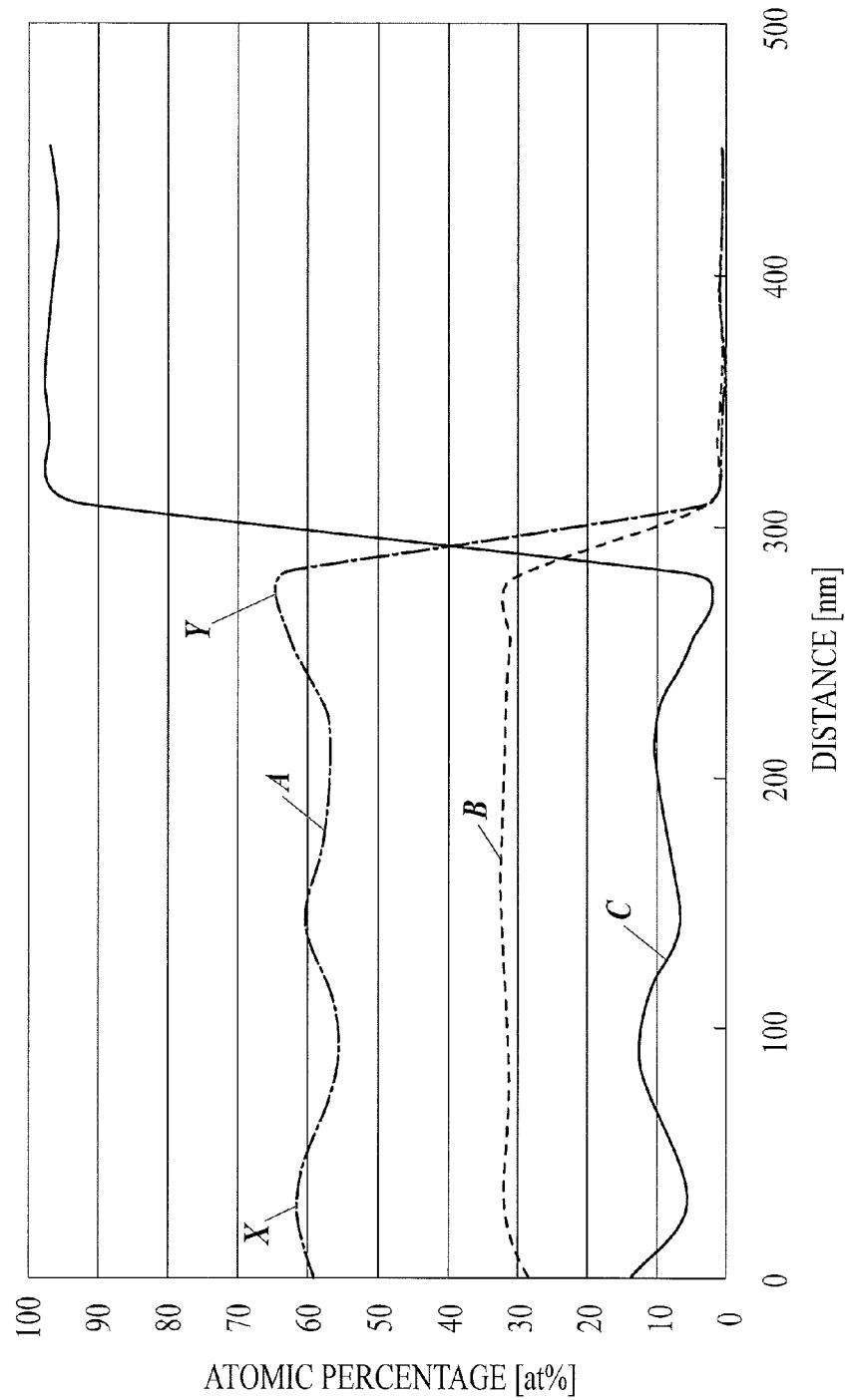
FIG. 4 is a graph illustrating depth profiles of elements in the thickness direction of the gas barrier layer according to the present invention obtained through XPS analysis.

FIG. 4 is a graph illustrating depth profiles of elements in the thickness direction of the gas barrier layer according to an embodiment of the present invention obtained through XPS analysis.

FIG. 4 includes an oxygen distribution curve A, a silicon distribution curve B, and a carbon distribution curve C.

The atomic percentage of each element continuously vary between the surface (distance is 0 nm) of the gas barrier layer and the surface of the substrate (distance is approximately 300 nm). In order to prevent permeation of water molecules from the substrate, the values X and Y of the atomic percentage of oxygen should be X<Y, where X is the atomic percentage of oxygen at a local maximum point closest to the surface of the gas barrier layer on the oxygen distribution curve A and Y is the atomic percentage of oxygen at a local maximum point closest to the substrate surface.

The atomic percentage of oxygen in the present invention at the local maximum point of the oxygen distribution curve closest to the surface, adjacent to the substrate, of the gas barrier layer is preferably 1.05 times or more the atomic percentage of oxygen at the local maximum point of the oxygen distribution curve closest to the surface, remote from the substrate, of the gas barrier layer. That is, it is preferred that $1.05 \leq Y/X$.

Although any upper limit may be selected, the upper limit is preferably $1.05 \leq Y/X \leq 1.30$, more preferably $1.05 \leq Y/X \leq 1.20$. The permeation of water molecules can be prevented within these ranges without degradation of the gas barrier properties under high temperature and high humidity. These ranges are also preferred for productivity and cost effectiveness.

On the oxygen distribution curve of the gas barrier layer, the absolute value of the difference of the maximum value and the minimum value of the atomic percentage of oxygen is preferably 5 at % or more, more preferably 6 at % or more, most preferably 7 at % or more.

<Relationship Between Maximum Value and Minimum Value of Atomic Percentage of Silicon>

According to the present invention, the absolute value of the difference between the maximum value and the minimum value of the atomic percentage of silicon on a silicon distribution curve of the gas barrier layer is preferably less than 5 at %, more preferably less than 4 at %, most preferably less than 3 at %. The absolute value of the difference within this range provides a gas barrier film having satisfactory gas barrier properties and a gas barrier layer having a mechanical strength.

<XPS Depth Profiling>

The carbon, oxygen, and silicon distribution curves across the depth of the gas barrier layer can be prepared through XPS depth profiling in which the interior of the specimen is exposed in sequence for analysis of the surface composition through a combination of X-ray photoelectron spectroscopy (XPS) and ion-beam sputtering using a noble gas, such as argon. Each distribution curve acquired through such XPS depth profiling has, for example, a vertical axis representing the atomic percentage (at %) of the element and a horizontal axis representing the etching time (sputtering time). With a distribution curve of an element versus the etching time (horizontal axis), the etching time correlates significantly with the distance from the surface of the gas barrier layer in the thickness direction of the gas barrier layer. Thus, "the distance from the surface of the gas barrier layer in the thickness direction of the gas barrier layer" can be the distance from the surface of the gas barrier layer calculated on the basis of the relationship between the etching rate and etching time used in the XPS depth profiling. For the XPS depth profiling, it is preferred to select ion-beam sputtering of noble gas using argon ($Ar^+$) as the ionic species and an etching rate of 0.05 nm/sec (equivalent to a value for a thermally-oxidized $SiO_2$ film).

According to the present invention, for the formation of a gas barrier layer having a uniform surface and superior gas barrier properties, it is preferred that the gas barrier layer be substantially uniform in the direction of the film surface (the direction parallel to the surface of the gas barrier layer). In this specification, a gas barrier layer being substantially uniform in the direction of the film surface means that, when oxygen and carbon distribution curves are created for any two points on the surface of the gas barrier layer obtained through XPS depth profiling, the carbon distribution curves for the two points contain the same number of local extremum points, and that the absolute values of the differences between the maximum value and the minimum value of the atomic percentage of carbon of the carbon distribution curves are identical or have a difference within 5 at % or less.

The gas barrier film according to the present invention should include at least one gas barrier layer that satisfies all of Conditions (i) to (iv) described above and may include two or more gas barrier layers that satisfy the conditions. If two or more gas barrier layers are provided, the gas barrier layers may be composed of an identical material or different materials. If two or more gas barrier layers are provided, the gas barrier layers may be disposed on one of the sides of the substrate or on both sides of the substrate. One or more of the gas barrier layers may be replaced with a layer or layers that do not have gas barrier properties.

If the silicon, oxygen, and carbon distribution curves respectively have atomic percentages of silicon, oxygen, and carbon that satisfy the condition represented by Expression (1) in an area corresponding to 90% or more of the thickness of the gas barrier layer, the atomic percentage of silicon in the gas barrier layer is preferably within the range of 25 to 45 at %, more preferably 30 to 40 at %.

The atomic percentage of oxygen in the gas barrier layer is preferably within the range of 33 to 67 at %, more preferably 45 to 67 at %.

The atomic percentage of carbon in the gas barrier layer is preferably within the range of 3 to 33 at %, more preferably 3 to 25 at %.

<Thickness of Gas Barrier Layer>

The thickness of the gas barrier layer is preferably within the range of 5 to 3000 nm, more preferably 10 to 2000 nm, more preferably 100 to 1000 nm, more preferably 300 to 1000 nm. A gas barrier layer having a thickness within these ranges has superior gas barrier properties, such as the oxygen gas barrier rate and the water vapor barrier rate, and do not experience degradation of gas barrier properties after bending.

If the gas barrier film according to the present invention includes a plurality of gas barrier layers, the total thickness of the gas barrier layers is normally within the range of 10 to 10000 nm, preferably 10 to 5000 nm, more preferably 100 to 3000 nm, most preferably 200 to 2000 nm. Gas barrier layers having a total thickness within these ranges achieve sufficient gas barrier properties, such as the oxygen gas barrier rate and the water vapor barrier rate, and are less susceptible to bending that could cause degradation of the gas barrier properties.

<Method for Manufacturing Gas Barrier Layer>

A gas barrier layer according to the present invention is preferably formed through plasma enhanced chemical vapor deposition. More specifically, the gas barrier layer is preferably formed through plasma enhanced chemical vapor deposition in which a resin substrate is conveyed in contact with a pair of deposition rollers and is exposed to plasma discharge while deposition gas is supplied between the deposition rollers. During discharge between a pair of deposition rollers, it is preferred that the polarities of the deposition rollers be alternately inverted. The deposition gas used in such plasma enhanced chemical vapor deposition preferably includes organosilicon compound and oxygen. The content of the oxygen in the deposition gas to be supplied is preferably equal to or less than a theoretical quantity required for the complete oxidation of the entire quantity of the organosilicon compound in the deposition gas. The gas barrier layer in the gas barrier film according to the present invention is preferably formed through a continuous deposition process.

A method for manufacturing the gas barrier film according to the present invention will now be described. The gas barrier film according to the present invention is preferably formed through plasma enhanced chemical vapor deposition (plasma enhanced CVD) in view of gas barrier properties. The plasma enhanced chemical vapor deposition may use Penning discharge plasma.

A layer having an atomic percentage of carbon that has a concentration gradient and continuously varies in the layer, such as the gas barrier layer according to the present invention, can be formed through plasma enhanced chemical vapor deposition involving plasma generation preferably by plasma discharge generated in the space between multiple deposition rollers. In the present invention, it is preferred to generate plasma through an electric discharge in the space between the deposition rollers which are conveying a strip of a resin substrate while in contact with the strip. The generation of plasma through an electric discharge in the space between the deposition rollers which are conveying a resin substrate while in contact with the substrate varies the distance between the resin substrate and the position of the plasma discharge between the deposition rollers. This can form a gas barrier layer having an atomic percentage of carbon that has a concentration gradient and continuously varies in the layer.

Simultaneous formation is achieved for a portion of the surface of the resin substrate on one of the deposition rollers during the formation of the gas barrier layer and another portion of the surface of the resin substrate on the other deposition roller. This achieves efficient formation of thin films, doubles the deposition rate, and provides films with an identical structure. Thus, the number of local extremum points in the carbon distribution curves can at least be doubled, and gas barrier layers that satisfy all of Conditions (i) to (iv) of the present invention can be efficiently produced.

The gas barrier film according to the present invention preferably includes a gas barrier layer formed over the surface of a substrate preferably through a roll-to-roll processing in view of productivity.

Although any apparatus can be used for the production of gas barrier films through plasma enhanced chemical vapor deposition, the apparatus preferably should include at least a pair of deposition rollers and a plasma power source and be capable of discharging in the space between the deposition rollers. For example, the manufacturing apparatus illustrated in FIG. 2 can manufacture gas barrier films through plasma enhanced chemical vapor deposition in a roll-to-roll process.

Figure 2:
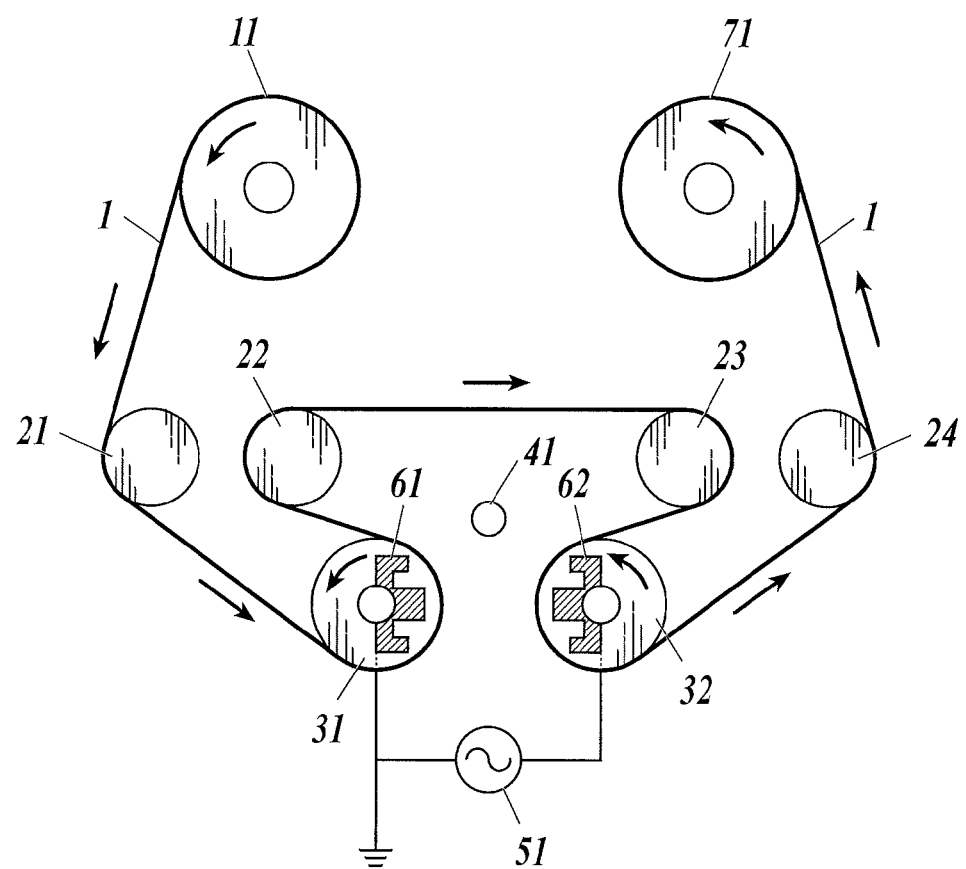
FIG. 2 illustrates the outline of an example apparatus for manufacturing a gas barrier film.

With reference to FIG. 2, a method for manufacturing a gas barrier film according to the present invention will now be described in detail. FIG. 2 is a schematic view illustrating an example apparatus preferred for manufacturing a gas barrier film according to the present invention.

The manufacturing apparatus illustrated in FIG. 2 includes a delivery roller 11, conveyer rollers 21, 22, 23, and 24, deposition rollers 31 and 32, a gas inlet 41, a power source 51 for plasma generation, magnetic-field generators 61 and 62 disposed inside the deposition rollers 31 and 32, and a reeling roller 71. Such a manufacturing apparatus includes a vacuum chamber (not shown) that accommodates at least the deposition rollers 31 and 32, the gas inlet 41, the power source 51 for plasma generation, and the magnetic-field generators 61 and 62 constituted of permanent magnets. The vacuum chamber of such a manufacturing apparatus is connected to a vacuum pump (not shown). The vacuum pump can appropriately adjust the pressure in the vacuum chamber.

The deposition rollers of such a manufacturing apparatus are connected to the power source 51 for plasma generation such that a pair of deposition rollers (deposition rollers 31 and 32) can function as opposing electrodes. Thus, in such a manufacturing apparatus, electric power can be supplied from the power source 51 for plasma generation and discharged in the space between the deposition rollers 31 and 32. This can generate plasma in the space between the deposition rollers 31 and 32. The deposition rollers 31 and 32 can be used as electrodes by appropriately selecting the material and design suitable as electrodes. The deposition rollers (deposition rollers 31 and 32) in such a manufacturing apparatus are preferably disposed such that the central axes of the rollers 31 and 32 are substantially parallel to each other on a single plane. Such arrangement of the deposition rollers (deposition rollers 31 and 32) can double the deposition rate and at least double the number of local extremum points in the carbon distribution curve because film with an identical structure can be deposited.

The deposition rollers 31 and 32 respectively accommodate the magnetic-field generators 61 and 62, which are fixed without rotation even when the deposition rollers rotate.

The deposition rollers 31 and 32 may be any appropriate known roller. The deposition rollers 31 and 32 are preferred to have identical diameters in view of the efficient deposition of the films. The diameter of the deposition rollers 31 and 32 is preferably in the range of 300 to 1000 mm, more preferably 300 to 700 mm, in view of the discharge conditions and the space in the chamber. A diameter or 300 mm or larger is preferred because the plasma discharge space is large enough to maintain productivity, and the total heat from the plasma discharge is prevented from being applied to the film in a short time to reduce damage to the substrate. A diameter of 1000 mm or smaller is preferred in view of a practical design of the apparatus including uniformity of the plasma discharge space.

The delivery roller 11 and the conveyer rollers 21, 22, 23, and 24 of such a manufacturing apparatus may be any appropriate known roller. The reeling roller 71 may be any appropriate known roller that can real the resin substrate 1 including the gas barrier layer.

The gas inlet 41 may be any appropriate inlet that can supply or discharge a material gas at a predetermined rate. The power source 51 for plasma generation may be any appropriate power source for a known plasma generator. The power source 51 for plasma generation supplies power to the deposition rollers 31 and 32 connected thereto and can use the deposition rollers 31 and 32 as opposing electrodes for electrical discharge. The power source 51 for plasma generation is preferably a source (AC source, for example) that can alternatively invert the polarities of the deposition rollers so as to efficiently perform plasma enhanced CVD. The power source 51 for plasma generation is preferred to apply power in the range of 100 W to 10 kW and have an AC frequency in the range of 50 Hz to 500 kHz so as to efficiently perform plasma enhanced CVD. The magnetic-field generators 61 and 62 may be any appropriate known magnetic-field generator.

The manufacturing apparatus, such as that illustrated in FIG. 2, can manufacture the gas barrier film according to the present invention through appropriate adjustment of, for example, the type of material gas, the electric power of the electrode drum in the plasma generator, the pressure in the vacuum chamber, the diameter of the deposition rollers, and the conveying rate of the resin substrate. That is the manufacturing apparatus illustrated in FIG. 2 supplies a deposition gas (for example, material gas) into the vacuum chamber and generates plasma discharge between the deposition rollers (deposition rollers 31 and 32) so as to breakdown the deposition gas (for example, material gas) by the plasma, and deposit the gas barrier layer on the surface of the resin substrate 1 on the deposition rollers 31 and 32 through plasma enhanced CVD. Through such deposition process, the resin substrate 1 is conveyed by the delivery roller 11, the deposition roller 31, and other rollers, and the gas barrier layer is formed on the surface of the resin substrate 1 through continuous roll-to-roll deposition.

The gas barrier layer according to the present invention has the following characteristic: (iv) the value of the local maximum point of the oxygen distribution curve closest to the surface, adjacent to the substrate, of the gas barrier layer is the largest of the values of the local maximum points of the oxygen distribution curve of the gas barrier layer. In the present invention, the atomic percentage of oxygen at the local maximum point of the oxygen distribution curve closest to the surface, adjacent to the substrate, of the gas barrier layer is preferably 1.05 times or more the atomic percentage of oxygen at the local maximum point of the oxygen distribution curve closest to the surface, remote from the substrate, of the gas barrier layer.

Although the deposition process of a gas barrier layer having a predetermined distribution of atomic percentage of oxygen is not limited, the following schemes are preferred.

(i) Varying the concentration of the deposition gas during deposition: the deposition gas is supplied with an oxygen content higher than that in a steady state during the initial period of the deposition on the substrate.

(ii) Supplying the gas to multiple inlets: usually, the gas inlet 41 is provided in the middle of the deposition rollers 31 and 32; additionally, a gas inlet 41' may be provided near the deposition roller 31 or 32 to control the concentration of the supplied deposition gas.

(iii) Controlling the flow of the gas with a baffle near the gas inlet: a movable baffle is provided near the deposition roller 31 or 32 to control the flow of the gas from the gas inlet 41 and thus control the concentration of the supplied deposition gas.

(iv) Performing plasma enhanced CVD multiple times at different concentrations of the deposition gas: a tandem plasma enhanced CVD system, which consist of two or three connected deposition devices, performs deposition such that the concentration of the deposition gas is highest at the first deposition device for deposition of film adjacent to the substrate, second highest at the second deposition device, and third highest at the third deposition device.

(v) Varying the position of the gas inlet: the concentration of deposition gas is controlled by moving the gas inlet 41 closer to one of the deposition rollers 31 and 32. The concentration of the deposition gas increases as the gas inlet is moved closer to one of the deposition rollers.

Among the schemes described above, (v) is preferred in view of simplicity and repeatability.

Figure 3:
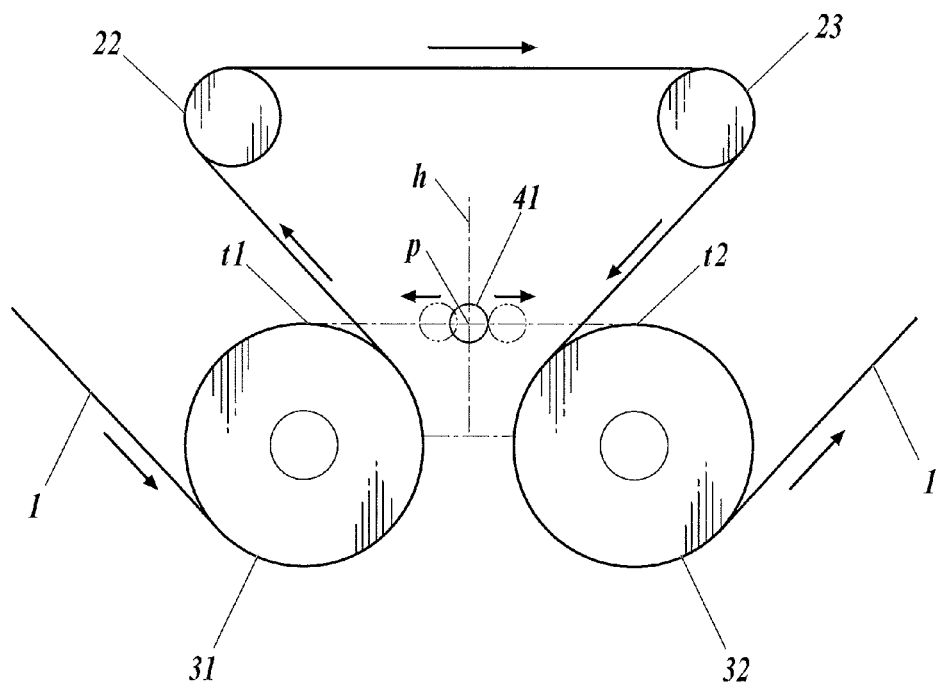
FIG. 3 is a schematic view of the positioning of a gas inlet.

FIG. 3 is a schematic view illustrating the movement of the gas inlet in the CVD system.

If the distance between the gas inlet 41 and the deposition roller 31 or 32 is 100%, the gas inlet 41 can be moved toward the deposition roller 31 or 32 in the range of 5% to 20% from the perpendicular bisector h of the line segment connecting the deposition rollers 31 and 32 so as to control the values of the local extremum points of the oxygen distribution curve to satisfy (iv). That is, specifically, the gas inlet 41 is moved parallel toward the deposition roller (toward $t_1$ or $t_2$) in the range of 5% to 20% from point p, where point p is a point on the perpendicular bisector h of the line segment connecting the deposition rollers 31 and 32, and the distance $(t_1-p)$ or the distance $(t_2-p)$ is 100%.

In such a case, the movement of the gas inlet 41 can control the value of the local extremum point of the oxygen distribution curve depending on the distance of the movement. For example, the value of local maximum point of the oxygen distribution curve of the surface, closest to the substrate, of the gas barrier layer can be increased by moving the gas inlet 41 closer to the deposition roller 31 or 32.

The gas inlet is moved preferably in the range of 5% to 20%, more preferably 5% to 15%. A movement within such a range can suppress variation in the oxygen distribution curve of the surface and other distribution curves, and thus can reproduce a predetermined uniform distribution.

FIG. 4 illustrates depth profiles of elements in the thickness direction of the gas barrier layer according to this embodiment of the present invention obtained through XPS analysis after deposition with the gas inlet 41 moved toward the deposition roller 31 by 5%.

Figure 5:
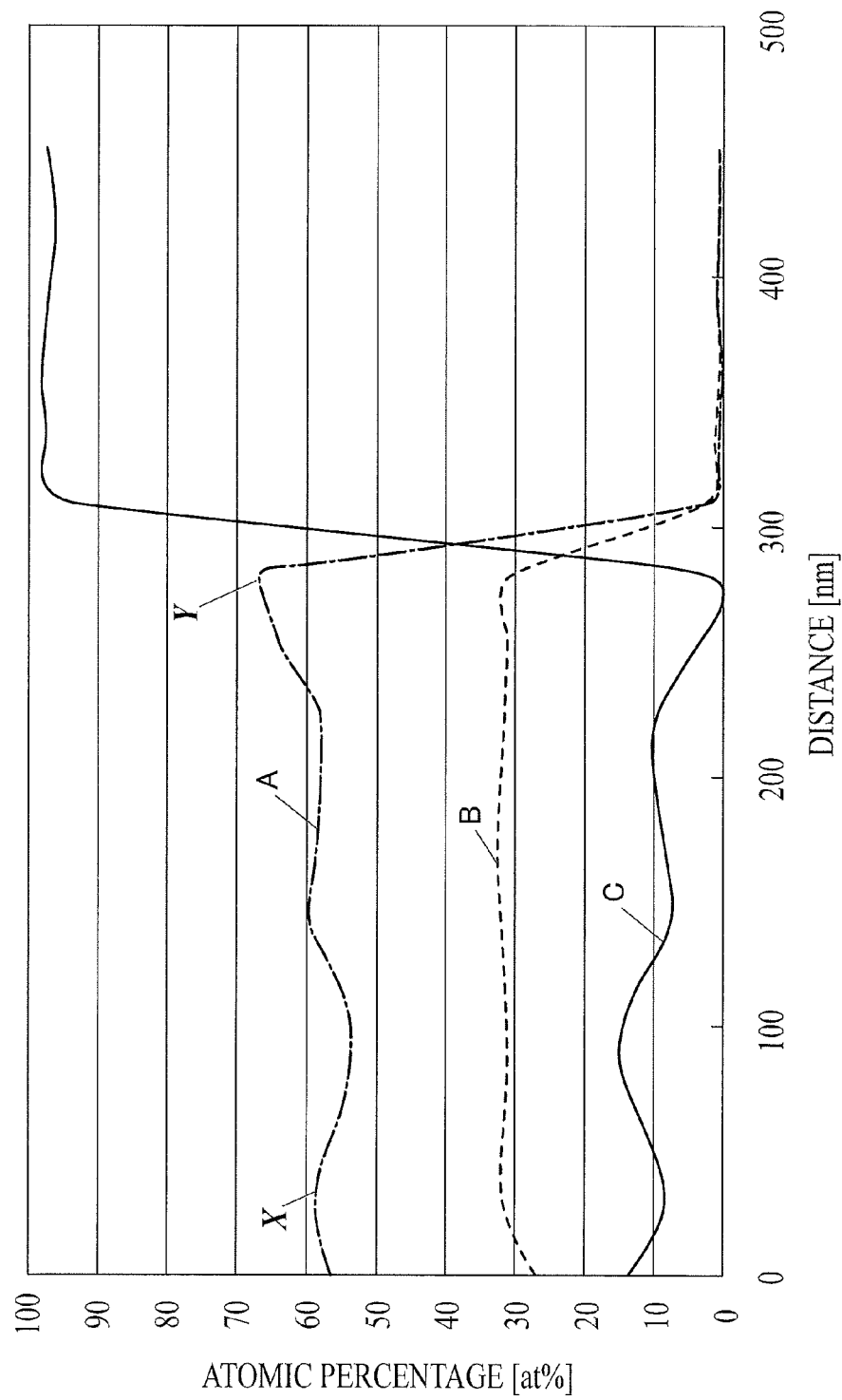
FIG. 5 is a graph illustrating depth profiles of elements in the thickness direction of the gas barrier layer according to another example of the present invention obtained through XPS analysis.

FIG. 5 illustrates depth profiles of elements in the thickness direction of the gas barrier layer according to this embodiment obtained through XPS analysis after deposition with the gas inlet 41 moved toward the deposition roller 32 by 10%.

The values X and Y of the atomic percentage of oxygen is X<Y, where X is the atomic percentage of oxygen at a local maximum point closest to the surface of the gas barrier layer on the oxygen distribution curve A, and Y is the atomic percentage of oxygen at a local maximum point closest to the substrate surface.

Figure 6:
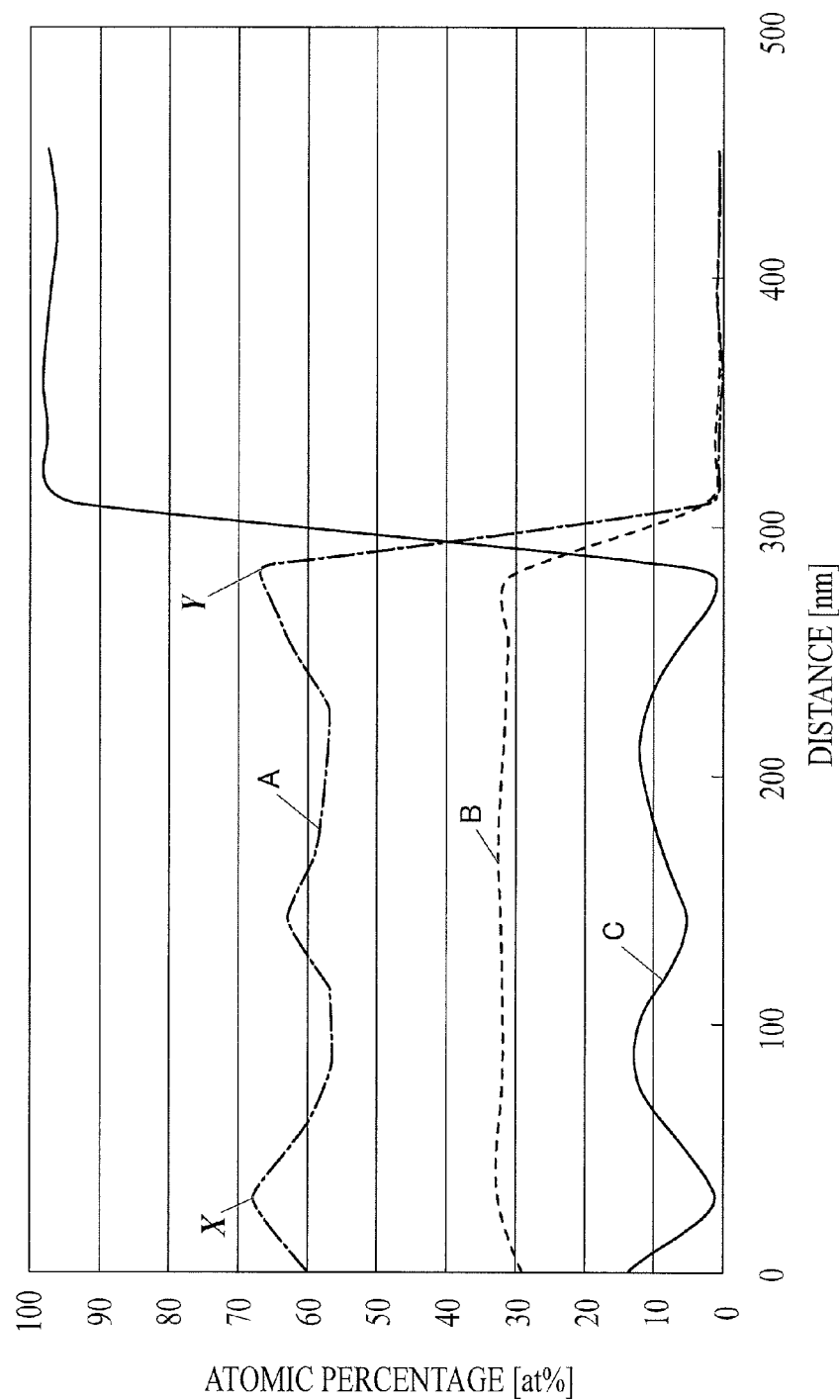
FIG. 6 is a graph illustrating depth profiles of elements in the gas barrier layer according to a comparative example through XPS analysis.

FIG. 6 illustrates depth profiles of elements in the thickness direction of the gas barrier layer according to a comparative example obtained through XPS analysis. The gas barrier layer is formed by disposing the gas inlet 41 on a perpendicular bisector h of the line segment connecting the deposition rollers 31 and 32. The atomic percentage of oxygen at the local maximum point of the oxygen distribution curve closest to the surface, adjacent to the substrate, of the gas barrier layer is substantially the same as the atomic percentage of oxygen at the local maximum point of the oxygen distribution curve closest to the surface, remote from the substrate, of the gas barrier layer. Thus, the value of the local maximum point of the oxygen distribution curve closest to the surface, adjacent to the substrate, of the gas barrier layer is not the maximum value in the layer.

<Material Gas>

The material gas in the deposition gas used for the deposition of the gas barrier layer according to the present invention may be appropriately selected depending on the material of the gas barrier layer to be formed. The material gas is preferably composed of, for example, organosilicon compounds containing silicon. Such organosilicon compounds include, for example, hexamethyldisiloxane, 1,1,3,3-tetramethyldisiloxane, trimethyl(vinyl)silane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. Among these organosilicon compounds, hexamethyldisiloxane and 1,1,3,3-tetramethyldisiloxane are preferred in view of the handling during deposition and the gas barrier properties of the resulting gas barrier layer. These organosilicon compounds may be used alone or in combination.

The deposition gas may contain a reactive gas in addition to the material gas. Such a reactive gas may be appropriately selected from gases that produce inorganic compounds, such as oxides and nitrides, through reaction with the material gas. The reactive gas for the production of oxides includes oxygen and ozone. The reactive gas for the production of nitrides includes nitrogen and ammonia. The reactive gas may be used alone or in combination. For example, for the production of an oxynitride, a reactive gas for the production of oxides can be combined with a reactive gas for the production of nitrides.

The deposition gas may contain a carrier gas, if required, for the supplying of the material gas to the vacuum chamber. The deposition gas may contain a discharge gas, if required, for the generation of plasma discharge. Such carrier gas and discharge gas can be any appropriate known gas, including noble gases, such as helium, argon, neon, and xenon, and hydrogen.

Such a deposition gas containing a material gas and a reactive gas preferably include the reactive gas at a percentage not too higher than the theoretical percentage of the reactive gas required for complete reaction of the material gas and the reactive gas. If the percentage of the reactive gas is too high, the gas barrier layer according to the present invention cannot be readily prepared. A barrier film having predetermined properties can be prepared through the use of a deposition gas preferably having a percentage of oxygen equal to or less than a theoretical percentage of oxygen required for complete oxidation of all the organosilicon compound in the deposition gas, which contains organosilicon compound and oxygen.

As a representative example, hexamethyldisiloxane (organosilicon compound (HMDSO: $(CH_3)_6Si_2O$)) is now described as a material gas and oxygen ($O_2$) as a reactive gas.

For the formation of a silicon-oxygen thin film through a reaction of a deposition gas containing hexamethyldisiloxane (HMDSO: $(CH_3)_6Si_2O$) as a material gas and oxygen ($O_2$) as a reactive gas through plasma enhanced CVD, silicon dioxide is yielded through the following reaction:

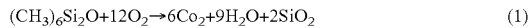

$$(CH_3)_6Si_2O+12O_2 \rightarrow 6Co_2+9H_2O+2SiO_2 \qquad (1)$$

In such a reaction, 12 moles of oxygen is required for complete oxidation of 1 mole of hexamethyldisiloxane. Thus, the complete reaction of a deposition gas containing 12 moles or more oxygen for each mole of hexamethyldisiloxane generates a uniform silicon dioxide layer. Thus, the flow rate of the material gas is adjusted to a rate equal to or less than the theoretical rate for complete reaction so as to maintain an incomplete reaction. That is, less than 12 moles of the oxygen should be provided for each mole of hexamethyldisiloxane, which is lower than the stoichiometric ratio of oxygen.

In an actual plasma enhanced CVD chamber, the hexamethyldisiloxane, which is the material gas, and the oxygen, which is the reactive gas, are supplied from the gas inlets to the deposition region. Thus, even if the quantity of the reactive oxygen gas in moles (flow rate) is 12 times of that of hexamethyldisiloxane, which is the material gas, the reaction actually cannot be completely accomplished. A complete reaction is presumed to be accomplished only when oxygen is supplied in a quantity that significantly exceeds the stoichiometric ratio (for example, the mole quantity (flow rate) of oxygen may be set to at least approximately 20 times of that of hexamethyldisiloxane so as to produce silicon oxide through a complete oxidation in CVD). Thus, the mole quantity (flow rate) of oxygen is preferably not more than 12 times, which is the stoichiometric ratio, more preferably not more than 10 times that of the hexamethyldisiloxane, which is the material gas. With such contents of hexamethyldisiloxane and oxygen, the carbon atoms and hydrogen atoms in the hexamethyldisiloxane that are not completely oxidized are absorbed by the gas barrier layer, enabling formation of a desired gas barrier layer. Thus, the resulting gas barrier film has superior barrier properties and flexure resistance. If the mole quantity (flow rate) of oxygen is too small relative to the mole quantity (flow rate) of hexamethyldisiloxane in the deposition gas, the unoxidized carbon and hydrogen atoms are excessively absorbed by the gas barrier layer. Thus, the barrier film will have low transparency and cannot be used as flexible substrates for devices such as organic EL devices and organic thin-film photovoltaic cells, which require transparency. In this view, the lower limit of the mole quantity (flow rate) of oxygen relative to the mole quantity (flow rate) of hexamethyldisiloxane in the deposition gas is preferably 0.1 times or more the mole quantity (flow rate) of hexamethyldisiloxane, more preferably 0.5 times or more.

<Vacuum Level>

The pressure (vacuum level) in the vacuum chamber can be appropriately adjusted depending on the type of material gas and is preferably in the range of 0.5 to 100 Pa.

<Roller Deposition>

In such a plasma enhanced CVD, the electrical power to be applied to electrode drums connected to the power source 51 for plasma generation (which are disposed on the deposition rollers 31 and 32 in this embodiment) for electrical discharge between the deposition rollers 31 and 32 can be appropriately adjusted depending on the type of the material gas and the pressure in the vacuum chamber. Although the electrical power may vary, the preferred electrical power is in the range of 0.1 to 10 kW. Electrical power applied within such a range does not generate particles, and the heat generated during deposition is controllable. Thus, heat damage and wrinkles in the resin substrate due to the increase in temperature at the surface of the substrate during deposition do not occur. The possibility of damaging deposition rollers is small due to the melting of the resin substrate due to heat and the discharge of a large current between the bare deposition rollers.

The conveying rate (line rate) of the resin substrate 1 can be appropriately adjusted depending on the type of material gas and the pressure in the vacuum chamber and is preferably in the range of 0.25 to 100 m/min, more preferably 0.5 to 20 m/min. If the line rate is within these ranges, wrinkles in the resin substrate due to heat are not readily formed, and the thickness of the gas barrier layer to be deposited can be sufficiently controlled.

<Primary Layer>

The primary layer 2 according to the present invention is disposed between the substrate and the gas barrier layer and is composed of polymers containing carbon. The primary layer 2 planarizes the minute projections on the surface of the resin substrate 1 to avoid formation of unevenness and pinholes on the gas barrier layer 3 deposited over the resin substrate 1. The primary layer 2 also enhances the adhesiveness of the layers and the flexibility contributing to high flexure resistance.

The primary layer 2 is composed of polymers containing carbon, preferably composed of a resin composition of which the main constituent is (meth)acrylate containing phosphoester groups and multifunctional (meth)acrylate.

The mass ratio A/B of (meth)acrylate (A) containing phosphoester groups and the multifunctional (meth)acrylate (B) is preferably in the range of 3/100 to 30/100.

<Multifunctional (Meth)acrylate>

The multifunctional (meth)acrylate in the present invention is primarily composed of acrylate and/or methacrylate containing multifunctional groups (typically two or more functional groups) (hereinafter (meth)acrylate refers to acrylate and/or methacrylate). Two or more multifunctional (meth)acrylates and resins having a small number of unsaturated groups may also be used in combination.

Examples of the multifunctional acrylates include 1,4-butanediol diacrylate, 1,6-hexanediol diacrylate, neopentylglycol diacrylate, polyethylene glycol diacrylate, hydroxypivalic acid neopentylglycol diacrylate, dicyclopentenyl diacrylate, caprolactone modified dicyclopentenyl diacrylate, ethylene oxide modified phosphate diacrylate, allylated cyclohexyl diacrylate, isocyanurate diacrylate, trimethylolpropane triacrylate, dipentaerythritol triacrylate, propionic modified dipentaerythritol triacrylate, pentaerythritol triacrylate, propylene oxide modified trimethylolpropane triacrylate, tris(acryloxyethyl) isocyanurate, dipentaerythritol pentaacrylate, propionic modified dipentaerythritol pentaacrylate, dipentaerythritol hexaacrylate, caprolactone modified dipentaerythritol hexaacrylate, and commercially available urethane acrylates and melamine acrylates. Acrylates with a large number of functional groups are preferred due to their high surface hardness. These acrylates may be used alone or in combination. The acrylates may be monomers or prepolymers.

Examples of the multifunctional methacrylates include ethylene glycol dimethacrylate, triethylene glycol dimethacrylate, 1,4-butanediol dimethacrylate, neopentylglycol dimethacrylate, 1,6-hexanediol dimethacrylate, 1,9-nonanediol dimethacrylate, 1,10-decanediol dimethacrylate, glycerol dimethacrylate, dimethyloltricyclodecane dimethacrylate, trimethylolpropane trimethacrylate, and ethoxylated trimethylolpropane trimethacrylate. These methacrylates may be used alone or in combination.

The multifunctional methacrylates in the present invention are preferably methacrylate compounds containing two or three methacryloyl groups, more preferably three methacryloyl groups, which have high interlayer adhesiveness.

The multifunctional (meth)acrylates in the present invention is preferably (meth)acrylate oligomers containing benzyl groups.

The (meth)acrylate oligomers containing benzyl groups refer to compounds containing benzyl groups and (meth)acryloyl groups. An example production process involves a reaction of a polyol containing benzyl groups, an isocyanate compound, and a (meth)acrylate compound containing hydroxy groups in the absence or presence of organic solvent.

Examples of the polyols containing benzyl groups include acrylic polyols containing benzyl groups, polyester polyols, and polycarbonate polyols. An example commercially available product is Q182 (product name) manufactured by Mitsui Chemicals, Inc. Two or more polyols containing benzyl groups may be used in combination.

The isocyanate compound refers to a compound containing two or more isocyanate groups. Examples of the isocyanate monomers include tolylene diisocyanate, diphenylmethane diisocyanate, xylylene diisocyanate, isophorone diisocyanate, and hexamethylene diisocyanate. Examples of the organic polyisocyanates include polyisocyanates of adduct, isocyanurate, and burette types, which are synthesized from isocyanate monomers. Two or more isocyanate compounds may be combined.

The (meth)acrylate compounds containing hydroxy groups refer to compounds containing hydroxy groups and (meth)acryloyl groups. Specific examples include 2-hydroxy-3-phenoxypropyl acrylate, isocyanuric acid ethylene oxide modified diacrylate, and pentaerythritol triacrylate. Two or more (meth)acrylate compounds containing hydroxy groups may be used in combination.

A synthetic example of (meth)acrylate oligomers containing benzyl groups from polyols containing benzyl groups, isocyanate compounds, and (meth)acrylate compounds containing hydroxy groups involves a reaction of isocyanate compounds and (meth)acrylate compounds containing hydroxy groups in the absence or presence of organic solvent. The reaction is continued until the peak of the isocyanate group obtained through infrared absorption analysis reaches half the original value. A polyol containing benzyl groups is then added and the reaction is continued until the peak of the isocyanate groups disappears.

The multifunctional (meth)acrylate in the present invention is preferably a combination of a methacrylate compound containing two or three methacryloyl groups and an acrylate oligomer containing benzyl groups.

The solid content of methacrylate compound containing two or three methacryloyl groups is preferably in the range of 0.5 to 50 parts by mass, more preferably 1 to 30 parts by mass relative to 100 parts by mass of (meth)acrylate oligomer containing benzyl groups.

<(Meth)acrylate Containing Phosphoester Groups>

Examples of the (meth)acrylates containing phosphoester groups in the present invention include 2-(meth)acryloyloxyethyl dihydrophosphate, di-(2-(meth)acryloyloxy) hydrogen phosphate, and dipentaerythritol penta(meth)acryloyloxy dihydrogen phosphate. The reactivity of phosphate groups in the composition enhances the adhesiveness of the primary layer to the substrate.

The content of the (meth)acrylate containing phosphoester groups is preferably in the range of 1 to 30 parts by mass, more preferably 3 to 20 parts by mass relative to 100 parts by mass of multifunctional (meth)acrylate. A content less than 1 part by mass causes insufficient adhesiveness, whereas a content more than 30 parts by mass causes ready hydrolysis of the ester groups leading to low water resistance.

<Solvent>

Examples of the solvents used in a coating solution for the formation of the primary layer 2 and containing resin constituents mainly composed of (meth)acrylates containing phosphoester groups and multifunctional (meth)acrylates include, but should not be limited to, water, alcohols, aromatic hydrocarbons, ethers, ketones, and esters.

Examples of the alcohol solvents include methyl alcohol, ethyl alcohol, n-propyl alcohol, isopropyl alcohol, n-butyl alcohol, sec-butyl alcohol, tert-butyl alcohol, n-hexyl alcohol, n-octyl alcohol, ethylene glycol, diethylene glycol, triethylene glycol, ethylene glycol monobutyl ether, ethylene glycol monoethyl ether acetate, diethylene glycol monoethyl ether, propylene glycol monomethyl ether, propylene monomethyl ether acetate, diacetone alcohol, methyl cellosolve, ethyl cellosolve, propyl cellosolve, and butyl cellosolve.

Examples of the aromatic hydrocarbon solvents include toluene and xylene.

Examples of the ether solvents include tetrahydrofuran, 1,4-dioxane, and 1,2-dimethoxyethane.

Examples of the ketone solvents include cyclohexanone, acetone, methyl ethyl ketone, and methyl isobutyl ketone.

Examples of the esters solvents include methyl acetate, ethyl acetate, and ethoxyethyl acetate.

Other solvents, such as dichloroethane and acetic acid may also be used. These solvents may be used alone or in combination.

The solution for the formation of the primary layer preferably contains inorganic particles. Inorganic particles suppress cure shrinkage of the coating film and enhance the adhesiveness of the primary layer to the substrate.

The inorganic particles have a primary particle size of preferably less than 100 nm, more preferably less than 50 nm to maintain the transparency of the primary layer. A particle size of more than 100 nm is not preferred because of light scattering and a reduction in transparency caused by low transmittance.

Example of the inorganic particles include silica particles, such as dry process silica and wet process silica; metal oxide particles, such as titanium oxide, zirconium oxide, zinc oxide, tin oxide, cerium oxide, antimony oxide, mixed oxides of indium and tin, and mixed oxides of antimony and tin; and organic particles, such as particulate acrylic and styrene resins. In particular, nanodispersed silica particles prepared through dispersion of silica particles of 10 to 50 nm in an organic solvent is preferred in view of transparency and hardness.

The content of the inorganic particles is preferably in the range of 5 to 50 parts by mass, more preferably 10 to 40 parts by mass relative to total 100 parts by mass of (meth) acrylates containing phosphoester groups and multifunctional (meth)acrylates. A content less than 5 parts by mass cannot satisfactorily avoid cure shrinkage of the coating film nor enhance the adhesiveness. A content more than 50 parts by mass reduces the total amount of (meth)acrylates containing phosphoester groups and multifunctional (meth) acrylates in the coating film, and thus reduces the adhesiveness to the substrate and the hardness of the primary layer.

The coating solution for the formation of the primary layer contains a photopolymerization initiator, which cures the resin composition with ultraviolet rays.

Examples of the photopolymerization initiator include carbonyl compounds, such as acetophenone, 2,2-diethoxy-acetophenone, p-dimethylacetophenone, p-dimethylamino-propiophenone, benzophenone, 2-chlorobenzophenone, benzil, benzoin, benzoin methyl ether, benzoin ethyl ether, and benzoin isopropyl ether, and sulfur compounds, such as thioxanthone, 2-chlorothioxanthone, 2-methylthioxanthone, and tetramethylthiuram disulfide.

Examples of commercially available products of the photopolymerization initiator include Irgacures 184, 369, 651, and 500 (product names) (manufactured by BASF Japan Ltd.), LucirinLR8728 (product name) (manufactured by BASF Japan Ltd.), Darocures 1116 and 1173 (product names) (manufactured by Merck KGaA), and UbecrylP36 (product name) (manufactured by UCB S.A.).

The solution for the formation of the primary layer can be applied onto the resin substrate 1 by any known process. Examples of the application processes include spray coating, dip coating, roll coating, die coating, air-knife coating, blade coating, spin coating, reverse coating, gravure coating, and wire bar, and printing procedures, such as gravure printing, screen printing, offset printing, and inkjet printing.

The primary layer 2 preferably has a thickness in the range of 1 to 20 μm. The primary layer 2 having a thickness in such a range has sufficient hardness and does not crack.

The primary layer 2, if required, may further contain acrylic resin, urethane resin, styrene resin, phenolic resin, or melamine resin, which enhances the flexibility of the layer. The primary layer 2 may further contain inorganic fillers, such as barium hydroxide, magnesium hydroxide, aluminum hydroxide, silicon oxide, titanium oxide, calcium sulfate, barium sulfate, calcium carbonate, basic zinc carbonate, basic lead carbonate, silica, clay, talc, silica compounds, and titanium dioxide; coupling agents, such as silane coupling agents and titanate coupling agents; disinfectants; antiseptics; plasticizers; flow conditioners; antistatic agents; thickeners; pH adjusters; surfactants; leveling adjusters; defoamers; color pigments; and anticorrosive pigments. Antioxidants and ultraviolet absorbers may also be added to enhance light resistance.

<Second Gas Barrier Layer>

In the present invention, preferably a second gas barrier layer is provided through the application of a solution containing polysilazane on a first gas barrier layer according to the present invention so as to form a coating film and modification of the coating film by irradiation of vacuum ultraviolet rays (VUV rays) having a wavelength of 200 nm or less. The second gas barrier layer provided on the first gas barrier layer deposited through CVD is preferred because minute defects remaining on the first gas barrier layer can be covered with the polysilazane gas barrier component to enhance the gas barrier properties and flexure resistance.

The second gas barrier layer preferably has a thickness in the range of 1 to 500 nm, more preferably 10 to 300 nm. A thickness of 1 nm or more provides satisfactory gas barrier properties, and a thickness of 500 nm or less prevents cracking in the dense silicon oxynitride film.

<Polysilazane>

The term "polysilazane" according to the present invention refers to a polymer that has a structure having silicon-nitrogen bonds and is a precursor of silicon oxynitride. Preferred polysilazane has the following structure:

[Formula 1]

General Formula (1)

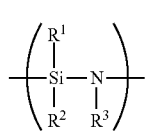

where $R^1$, $R^2$, and $R^3$ each represent a hydrogen atom, an alkyl group, an alkenyl group, a cycloalkyl group, an aryl group, an alkylsilyl group, an alkylamino group, or an alkoxy group.

According to the present invention, perhydropolysilazane, in which $R^1$, $R^2$, and $R^3$ are all hydrogen atoms, is particularly preferred to increase the density of the resulting gas barrier layer.

Perhydropolysilazane is presumed to have a linear chain structure and a cyclic structure of mainly 6- and 8-membered rings, has a number average molecular weight (Mn) of approximately 600 to 2000 (polystyrene equivalent by gel permeation chromatography), and is in the form of liquid or solid.

Polysilazane is commercially available in the form of solution of polysilazane in an organic solvent. A commercial product may be directly used as a coating solution containing polysilazane. Commercially available products of polysilazane solutions include NN120-20, NAX120-20, and NL120-20 manufactured by AZ Electronic Materials.

The second gas barrier layer can be manufactured through the application of the coating solution containing polysilazane to the first gas barrier layer manufactured through CVD, drying of the applied solution, and vacuum ultraviolet irradiation of the dried layer.

A preferred organic solvent used for the preparation of a polysilazane coating solution should not contain alcohol or water, which readily reacts with polysilazane. Examples of the organic solvents include hydrocarbon solvents, such as aliphatic hydrocarbon, alicyclic hydrocarbon, and aromatic hydrocarbon solvents; halogenated hydrocarbon solvents; and ethers, such as aliphatic ethers and alicyclic ethers. Specific examples include hydrocarbons, such as pentane, hexane, cyclohexane, toluene, xylene, Solvesso, and turpentine; halogenated hydrocarbons, such as methylene chloride and trichloroethane; and ethers, such as dibutyl ether, dioxane, and tetrahydrofuran. These organic solvents may be selected in view of the solubility of polysilazane and/or evaporation rate of the solvent. Mixtures of multiple organic solvents may also be used.

The content of polysilazane in the coating solution is preferably in the range of approximately 0.2 to 35 mass %, although it depends on the thickness of the gas barrier layer and the pot life of the coating solution.

The coating solution may contain an amine catalyst or a metal catalyst, such as a Pt compound, (e.g., Pt acetylacetonate), a Pd compound (e.g., propionic acid Pd), or an Rh compound (e.g., Rh acetylacetonate) to promote the modification to silicon oxynitride. Amine catalysts are most preferred in the present invention. Examples of the specific amine catalyst include N,N-diethylethanolamine, N,N-dimethylethanolamine, triethanolamine, triethylamine, 3-morpholinopropylamine, N,N,N',N'-tetramethyl-1,3-diaminopropane, and N,N,N',N'-tetramethyl-1,6-diaminohexane.

The content of catalyst added to polysilazane is preferably in the range of 0.1 to 10 mass %, more preferably 0.2 to 5 mass &, most preferably 0.5 to 2 mass % relative to the total solution. A catalyst added in such an amount can prevent the formation of excess silanol groups due to a rapid reaction, a decrease in the film density, and an increase in film defects.

The coating solution containing polysilazane can be applied through any appropriate procedure. For example, the coating solution may be applied through roll coating, flow coating, inkjet printing, spray coating, printing, dip coating, casting, bar coating, or gravure printing.

The thickness of the coating film can be appropriately determined depending on the intended use of the coating film. For example, the thickness of a dry coating film is preferably within the range of 50 nm to 2 μm, more preferably 70 nm to 1.5 μm, most preferably 100 nm to 1 μm.

<Excimer Process>

At least part of the polysilazane in the second gas barrier layer according to the present invention is modified to silicon oxynitride through vacuum ultraviolet irradiation of the layer containing polysilazane.

A presumed mechanism of the modification of the coating film containing polysilazane through vacuum ultraviolet irradiation into a specific composition $SiO_xN_y$ will be exemplified by perhydropolysilazane.

Perhydropolysilazane has a structure $—(SiH_2—NH)_n—$. Perhydropolysilazane is also represented by $SiO_xN_y$, where x=0 and y=1. An external oxygen source is necessary to achieve x>0. Examples of such external oxygen sources include (i) oxygen and water contained in the polysilazane coating solution; (ii) oxygen and water absorbed in the coating film from the atmosphere during application and drying; (iii) oxygen, water, ozone, and singlet oxygen absorbed in the coating film from the atmosphere during the vacuum ultraviolet irradiation; (iv) oxygen and water outgassed from the substrate and migrated into the coating film due to heat and other factors applied during the vacuum ultraviolet irradiation; and (v) oxygen and water absorbed by the coating film from an oxidizing atmosphere when the film is moved from a non-oxidizing atmosphere, where vacuum ultraviolet irradiation is performed, to the oxidizing atmosphere.

The upper limit of y is basically one because nitridation of Si atoms is very rare compared to oxidation thereof.

Basically, x and y are defined by $2x+3y\leq4$ on the basis of the number of valence electrons in Si, O, and N atoms. At y=0 after complete oxidation, the coating film contains silanol groups and x may satisfy $2<x<2.5$.

The presumed mechanism of the reaction that generates silicon oxynitride and then silicon oxide from perhydropolysilazane through vacuum ultraviolet irradiation will now be described.

(1) Dehydrogenation and the Accompanying Formation of Si—N Bonds

Probably, the Si—H bonds and N—H bonds in perhydropolysilazane break relatively readily due to excitation induced by the vacuum ultraviolet irradiation and recombine in the form of Si—N bonds under an inert atmosphere (dangling bonds may form in the Si atoms). That is, a cured film having a composition $SiN_y$ is formed without oxidation. In such a case, the polymer main chains are not broken. The scission of the Si—H bonds and the N—H bonds is accelerated by a catalyst or heat. Hydrogen formed by the bond scission is released in the form of $H_2$ from the film to the exterior.

(2) Formation of Si—O—Si Bonds Involving Hydrolysis and Dehydration

The Si—N bonds in the polymer main chains of perhydropolysilazane are hydrolyzed into Si—OH. Two Si—OHs are condensed by dehydration into a Si—O—Si bond (curing). Although such a reaction also occurs in the atmosphere, the main water source during the vacuum ultraviolet irradiation under an inert atmosphere is probably water vapor outgassed from the substrate due to the heat generated during the irradiation. Excess water causes some Si—OHs to remain without dehydration, and thus, a cured film having a composition $SiO_{2.1-2.3}$ has poor gas barrier properties.

(3) Formation of Si—O—Si Bonds Involving Direct Oxidation by Singlet Oxygen

An appropriate amount of oxygen in the atmosphere during the vacuum ultraviolet irradiation forms highly oxidative singlet oxygen. H and N atoms in perhydropolysilazane are replaced with O atoms to form Si—O—Si bonds and cure the film. The scission of the polymer main chains may also cause recombination of the bonds.

(4) Oxidation Accompanying Scission of Si—N Bonds Due to Vacuum Ultraviolet Irradiation and Excitation It is presumed that the energy of the vacuum ultraviolet rays, which is higher than the energy of the Si—N bonds in perhydropolysilazane, breaks the Si—N bonds and forms Si—O—Si bonds or Si—O—N bonds through oxidation if an oxygen source, such as oxygen, ozone, or water, is present in the environment. The scission of the polymer main chains may also cause recombination of the bonds.

The composition of silicon oxynitride in the layer containing polysilazane irradiated with the vacuum ultraviolet rays can be adjusted by controlling the oxidized level through an appropriate combination of the oxidation mechanisms (1) to (4).

In the vacuum ultraviolet irradiation process according to the present invention, the illuminance of the vacuum ultraviolet rays incident on the surface of the polysilazane coating film is preferably in the range of 30 to 200 mW/cm$^2$, more preferably 50 to 160 mW/cm$^2$. An illuminance of 30 mW/cm$^2$ or more maintains satisfactory modification efficiency. An illuminance of 200 mW/cm$^2$ or less avoids ablation of the coating film and damage to the substrate.

The irradiation energy of the vacuum ultraviolet rays incident on the surface of the polysilazane coating film is preferably in the range of 200 to 10000 mJ/cm$^2$, more preferably 500 to 5000 mJ/cm$^2$. An irradiation energy of 200 mJ/cm$^2$ or more achieves satisfactory modification. An irradiation energy of 10000 mJ/cm$^2$ or less avoids cracking due to excess modification and thermal deformation of the substrate.

The vacuum ultraviolet source of the vacuum ultraviolet irradiation process is preferably a noble gas excimer lamp. Noble gas is also referred to as inert gas because the atoms of noble gas, such as Xe, Kr, Ar, and Ne, do not form molecules by chemical bonding.

The excited atoms of the noble gas energized by electrical discharge can bond with other atoms to form molecules. If the noble gas is xenon:

$$e + Xe \rightarrow Xe^*;$$

$$Xe^* + 2Xe \rightarrow Xe_2^* + Xe; \text{ and}$$

$$Xe_2^* \rightarrow Xe + Xe + h\nu(172 \text{ nm}).$$

The excited excimer molecule $Xe_2^*$ returning to the ground state emits 172-nm excimer light.

An excimer lamp is highly efficient due to the radiation of light having a single wavelength and substantially no radiation of light with other wavelengths. The target can be maintained at a low temperature because of the absence of undesirable light. The lamp can be turned on/off instantaneously because it can start or restart in a short time.

Excimer emission is achieved through a dielectric-barrier discharge. Dielectric-barrier discharge is significantly narrow micro-discharge, similar to lightning, that is generated in a gas space in response to the application of a high-frequency high-voltage of several tens of kilohertz to electrodes, the gas space being disposed between the electrodes through dielectric substance, such as transparent quartz. The micro-discharge streamer reaching the tube wall (dielectric) charges the surface of the dielectric, and the micro-discharge vanishes.

Dielectric-barrier discharge is the repeated cycles of generation and vanishing of micro-discharges over the entire tube wall. Thus, the flickering of light can be visually confirmed. Streamers of significantly high temperatures directly reach local points of the tube wall and may accelerate degradation of the tube wall.

Besides the dielectric-barrier discharge, electrodeless field discharge is also effective means for excimer emission. The electrodeless field discharge occurs as a result of capacitive coupling and is also referred to as RF discharge. The lamp, the electrodes, and their arrangement are basically the same as those for the dielectric-barrier discharge. The high frequency applied to the electrodes illuminates the lamp at several MHz. Such spatially or temporally uniform discharge achieved through electrodeless field discharge provides a lamp having a long life without flickering.

Dielectric-barrier discharge generates micro-discharge only between the electrodes. Thus, discharge over the entire discharge space can only be achieved with external electrode covering the entire external surface and transmitting light for the light to go outside.

Thus, the electrode is composed of a mesh of thin metal wires. The electrode is composed of very thin wires that do not block light. Unfortunately, the electrode is readily damaged in an oxygen atmosphere by ozone generated by vacuum ultraviolet rays. This can only be avoided by providing an inert gas atmosphere, such as a nitrogen atmosphere, around the lamp inside the irradiation apparatus and radiating the light through a window of synthetic quartz. The window of synthetic quartz is an expensive consumable and also has light loss.

The outer circumference of the double cylinder lamp is approximately 25 mm. The difference between the distance from immediately below the lamp along the lamp axis to the irradiated surface and the distance from the side of the lamp to the irradiated surface is measurable, causing a significant difference in illuminance. Thus, a uniform illuminance distribution cannot be achieved even though the alignment of multiple lamps in close contact with each other. An irradiation apparatus having a window of synthetic quartz can establish a uniform distance and a uniform illuminance distribution in an oxygen atmosphere.

Electrodeless field discharge does not require an external mesh electrode. An external electrode disposed on part of the external surface of the lamp spreads the glow discharge throughout the entire discharge space. The external electrode is typically composed of an aluminum block that also functions as a light reflector and is disposed on the back of the lamp. The outer diameter of the lamp is large, similarly to that for a dielectric-barrier discharge. Thus, synthetic quartz is required for a uniform illuminance distribution.

The greatest advantage of a narrow-tube excimer lamp is a simple structure. A gas used for excimer emission is sealed inside a quartz tube with closed ends.

The outer diameter of the tube of the narrow-tube lamp is approximately 6 to 12 mm. A large diameter requires a high start-up voltage.

The form of discharge may be either dielectric-barrier discharge or electrodeless field discharge. Each electrode may have a flat contact surface in contact with the lamp. Alternatively, each electrode may have a curved contact surface that conforms with the surface of the lamp. In this way, the electrode firmly secures the lamp and tightly adheres to the lamp to stabilize the discharge. The curved surface may be composed of an aluminum mirror that functions as a light reflector.

A Xe excimer lamp radiates ultraviolet rays having a short uniform wavelength of 172 nm and thus has high light emission efficiency. The light from such a Xe excimer lamp, which has a large absorption coefficient to oxygen, enables generation of a high concentration of radical oxygen species and ozone from a slight amount of oxygen.

The light having a short wavelength of 172 nm has high energy that effectively breaks bonds of an organic substance. The high energy of active oxygen, ozone, and ultraviolet rays can modify the polysilazane layer within a short time.

Unlike low-pressure mercury lamps and plasma cleaning devices that generate light having wavelengths of 185 and 254 nm, respectively, an excimer lamp achieves a reduction in the process time required for high throughput, a reduction in the installation area, and an irradiation of organic materials and plastic substrates, which would be readily damaged by heat.

An excimer lamp can emit light at a high efficiency. Thus, the lamp can be driven with low electric power. An excimer lamp radiates energy having a short wavelength in the ultraviolet region without generating light having a long wavelength, which causes a temperature rise, and thus prevents a temperature rise at the surface of a target. These characteristics make an excimer lamp suitable for use on flexible film materials, such as PET, which are readily affected by heat.

Oxygen, which is required for the reaction in the vacuum ultraviolet irradiation process, absorbs vacuum ultraviolet rays. Thus, the irradiation with vacuum ultraviolet rays should be carried out in an atmosphere with an oxygen concentration as low as possible to maintain the efficiency of ultraviolet irradiation. Thus, the oxygen concentration during the vacuum ultraviolet irradiation is preferably in the range of 10 to 10000 ppm, more preferably 50 to 5000 ppm, most preferably 1000 to 4500 ppm.

A dry inert gas atmosphere is preferred for the vacuum ultraviolet irradiation. A dry nitrogen gas atmosphere is preferred for its cost advantage. The oxygen concentration can be controlled by measuring the flow rates of the oxygen gas and the inert gas fed into the irradiation chamber and varying the ratio of the flow rates.

<Overcoat Layer>

An overcoat layer may be formed on the second gas barrier layer according to the present invention so as to further enhance flexure resistance. The overcoat layer is preferably composed of an organic resin consisting of organic monomers, oligomers, or polymers, or an organic-inorganic composite resin consisting of monomers, oligomers, or polymers of siloxane and silsesquioxane containing organic groups. The organic resin and organic-inorganic composite resin preferably contain polymerizable groups and cross-linkable groups. The overcoat layer is preferably prepared through the application of an organic resin composition coating solution, which contains such an organic resin or organic-inorganic composite resin and, if required, a polymerization initiator and/or a cross-linker, and the curing of the resulting film through light irradiation or heating.

<Electronic Device>

The gas barrier film according to the present invention is preferably used for organic element devices. Examples of the organic element devices include organic electroluminescence elements (organic EL elements), organic photoelectric conversion elements, and liquid crystal elements.

<Organic EL Panel as Electronic Device>

The gas barrier film 1a (1b) according to the present invention can be used as a substrate of a photovoltaic cell, a liquid crystal display, or an organic EL element, or a sealing film in various electronic devices.

Figure 7:
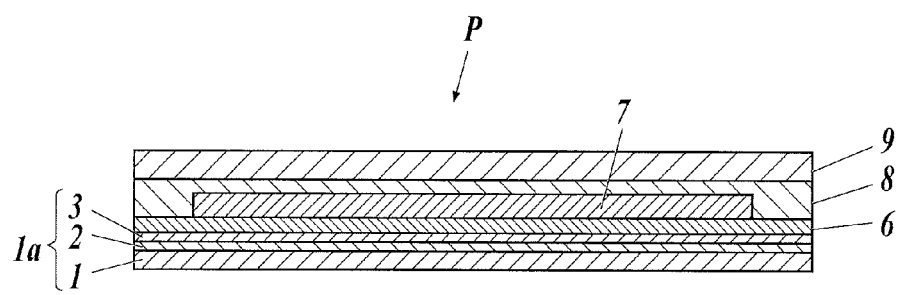
FIG. 7 is a schematic view of an organic EL panel including a gas barrier film according to the present invention.

FIG. 7 illustrates an example organic EL panel P, which is an electronic device, including the gas barrier film 1a as a sealing film.

With reference to FIG. 7, the organic EL panel P includes the gas barrier film 1a; a transparent electrode 6 of, for example, ITO, disposed on the gas barrier film 1a; an organic EL element 7, which is the main body of the electronic device, disposed over the gas barrier film 1a via the transparent electrode 6; and an opposing film 9 covering the organic EL element 7 with an adhesive layer 8 disposed therebetween. The transparent electrode 6 may constitute part of the organic EL element 7.

The transparent electrode 6 and the organic EL element 7 are disposed on the surface, adjacent to the gas barrier layer 3, of the gas barrier film 1a.

The organic EL element 7 in the organic EL panel P is sufficiently sealed from water vapor, is resistive to degradation, and thus enables the organic EL panel P to be used for a long time (prolonged service life).

The opposing film 9 may be a metal film, such as aluminum foil, or a gas barrier film according to the present invention. If the gas barrier film is used as the opposing film 9, the gas barrier film is bonded with the adhesive layer 8 such that the gas barrier layer 3 faces the organic EL element 7.

<Organic EL Element>

The organic EL element 7 sealed with the gas barrier film 1a in the organic EL panel P will now be described.

Preferred examples of the layer configuration of the organic EL element 7 will now be described; however, the present invention may have any other configuration:

(1) Anode/luminous layer/cathode;

(2) Anode/positive-hole transport layer/luminous layer/cathode;

(3) Anode/luminous layer/electron transport layer/cathode;

(4) Anode/positive-hole transport layer/luminous layer/electron transport layer/cathode; and (5) Anode/anode buffer layer (positive-hole injecting layer)/positive-hole transport layer/luminous layer/electron transport layer/cathode buffer layer (electron injecting layer)/cathode.

(Anode)

The anode (transparent electrode 6) of the organic EL element 7 is preferably composed of an electrode material having a large work function (4 eV or more), such as a metal, alloy, electroconductive compound, or a mixture thereof. Examples of the electrode material include metals, such as Au, and conductive transparent materials, such as CuI, indium tin oxide (ITO), $SnO_2$, and ZnO. Alternatively, the electrode material may be an amorphous material, such as IDIXO ($In_2O_3$—ZnO), which can be used for the formation of a transparent conductive film.

The anode is a thin film composed of such an electrode material obtained through vapor deposition or sputtering, for example. The thin film may be patterned to have a predetermined shape through photolithography. If the pattern does not require high precision (approximately 100 µm or more), a mask may be used during the vapor deposition or sputtering of the electrode material so as to form a predetermined pattern.

The transmittance of the anode is preferably more than 10% for the light to be taken out through the anode. The sheet resistance of the anode is preferably several hundred Ω/sq or less. Although the thickness of the anode varies depending on the material, the anode typically has a thickness in the range of 10 to 1000 nm, preferably 10 to 200 nm.

(Cathode)

The cathode of the organic EL element 7 is composed of an electrode material, such as a metal having a small work function (4 eV or less) (hereinafter referred to as electron-injecting metal), alloy, an electroconductive compound, or a mixtures thereof. Examples of the electrode material include sodium, alloys of sodium and potassium, magnesium, lithium, mixtures of magnesium and copper, mixtures of magnesium and silver, mixtures of magnesium and aluminum, mixtures of magnesium and indium, mixtures of aluminum and aluminum oxide ($Al_2O_3$), indium, mixtures of lithium and aluminum, and rare-earth metals. Among these materials, mixtures of an electron-injecting metal and a secondary metal, which is a stable metal having a work function larger than that of the electron-injecting metal, are preferred in view of their electron injecting ability and oxidation resistance. Examples of an electrode material particularly preferred for the cathode include mixtures of magnesium and silver, magnesium and aluminum, magnesium and indium, aluminum and aluminum oxide ($Al_2O_3$), and lithium and aluminum, and aluminum.

The cathode can be prepared as a thin film formed through vapor deposition or sputtering of an electrode material. The sheet resistance of the cathode is preferably several hundred $\Omega$/sq or less. The cathode typically has a thickness in the range of 10 nm to 5 μm, preferably 50 to 200 nm. The organic EL element 7 preferably includes a transparent or semitransparent anode or cathode in view of high light transmission, which enhances the emission luminance.

A transparent or semitransparent cathode can be produced through the formation of a metal film composed of any of the metals mentioned in the description on the cathode and having a thickness in the range of 1 to 20 nm, and the formation of another film composed of any of the conductive transparent materials mentioned in the description on the anode, on the metal film. Such a process can be applied to the production of an element including an anode and a cathode that are both transparent.

(Injecting Layer: Electron Injecting Layer and Positive-Hole Injecting Layer)

The injecting layers include an electron injecting layer and a positive-hole injecting layer, one of or both of which are provided as required. The positive-hole injecting layer is disposed between the anode and the luminous layer or positive-hole transport layer, and the electron injecting layer is disposed between the cathode and the luminous layer or electron transport layer.

The injecting layer, which is either a positive-hole injecting layer (anode buffer layer) or an electron injecting layer (cathode buffer layer), is disposed between an electrode and an organic layer to lower the driving voltage and enhance the emission luminance. Details of the injecting layer are described in Chapter 2 *"Denkyoku zairyou* (Electrode Materials)" in the second version of *"Yuuki EL soshi to sono kougyouka saizensen* (Organic EL Elements and the Forefront of Their Industrialization)" (Nov. 30, 1998, NTS Inc., pp. 123-166).

Details of the anode buffer layer (positive-hole injecting layer) are disclosed in Japanese Patent Application Laid-Open Publication Nos. 9-45479, 9-260062, and 8-288069. Examples of the anode buffer layer include a layer of phthalocyanine buffer represented by copper phthalocyanine; a layer of an oxide buffer represented by vanadium oxide; an amorphous carbon buffer layer; and a polymer buffer layer containing conductive polymers, such as polyaniline (emeraldine) or polythiophene.

Details of the cathode buffer layer (electron injecting layer) are disclosed in Japanese Patent Application Laid-Open Publication Nos. 6-325871, 9-17574, and 10-74586. Examples of the cathode buffer layer include a layer of a metal buffer, which is represented by strontium and aluminum; a layer of an alkaline metal compound buffer, which is represented by lithium fluoride; a layer of an alkaline-earth metal compound buffer, which is represented by magnesium fluoride; and a layer of an oxide buffer, which is represented by aluminum oxide. The buffer layer (injecting layer) is very thin, preferably having a thickness in the range of 0.1 nm to 5 μm, depending on the material.

(Luminous Layer)

The luminous layer of the organic EL element 7 emits light as a result of the recombination of electrons and positive holes from the electrodes (cathode and anode), the electron transport layer, or the positive-hole transport layer. The light-emitting area in the luminous layer may be inside the layer or at the interface with an adjacent layer.

The luminous layer of the organic EL element 7 preferably contains dopants (light-emitting dopants) and hosts (light-emitting hosts). This can further increase the light-emitting efficiency.

(Light-Emitting Dopant)

Light-emitting dopants can be categorized into fluorescent dopants that emit fluorescent light and phosphorescent dopants that emit phosphorescent light in a broad sense.

Representative examples of the fluorescent dopants include coumarin dyes, pyran dyes, cyanine dyes, croconium dyes, squarylium dyes, oxobenzanthracen dyes, fluorescein dyes, rhodamine dyes, pyrylium dyes, perylene dyes, stilbene dyes, polythiophene dyes, and phosphors of rare earth complexes.

Preferred examples of the phosphorescent dopants include complex compounds containing metal elements of Groups 8, 9, and 10, more preferred are iridium compounds and osmium compounds, most preferred is iridium compounds.

The light-emitting dopants may be used alone or in combination.

(Light-Emitting Hosts)

A light-emitting host (also simply referred to as host) is a compound having the highest content (mass) in the luminous layer that is composed of at least two types of compounds. The other compounds in the luminous layer are referred to as "dopant compounds (or simply, dopants)." For example, if the luminous layer is composed of two types of compounds A and B at a ratio of A:B=10:90, the compound A is the dopant compound whereas the compound B is the host compound. If the luminous layer is composed of three types of compounds A, B, and C at a ratio of A:B:C=5:10:85, the compounds A and B are the dopant compounds, and the compound C is the host compound.

The light-emitting host may have any structure. Typical examples of the light-emitting host material include carbazole derivatives, triarylamine derivatives, aromatic borane derivatives, nitrogen-containing heterocyclic compounds, thiophene derivatives, furan derivatives, structures having a basic skeleton of oligoarylene compounds, carboline derivatives, and diazacarbazole derivatives (a diazacarbazole derivative is a carboline derivative containing carboline rings composed of hydrocarbon rings in which at least one carbon atom is replaced with a nitrogen atom). Among these examples, the carboline derivatives and diazacarbazole derivatives are preferred.

The luminous layer composed of the compounds mentioned above can be formed through a known thin film deposition procedure, such as vacuum deposition, spin coating, casting, LB deposition, or inkjet printing. The luminous layer may have any thickness, typically in the range of 5 nm to 5 μm, preferably 5 to 200 nm. The luminous layer may have a single-layer structure composed of one or more types of dopants and hosts or a multilayer structure including sublayers having identical or different compositions.

(Positive-Hole Transport Layer)

The positive-hole transport layer is composed of a positive-hole transport material that can transport positive holes. A positive-hole injecting layer and an electron blocking layer are also categorized into a positive-hole transport layer in abroad sense. The positive-hole transport layer may have a monolayer or multilayer structure.

The positive-hole transport material may be any organic or inorganic material that can inject or transport positive holes or block electrons. Examples of the positive-hole transport material include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline copolymers, and conductive polymeric oligomers, particularly a thiophene oligomer. Although any of the above materials may be used as the positive-hole transport material, preferred compounds are porphyrin compounds, aromatic tertiary amine compounds, and styrylamine compounds, among which the aromatic tertiary amine compounds are the most preferred. The positive-hole transport material may be a polymeric material containing polymer chains including the materials mentioned above or polymeric main chains composed of the materials mentioned above. Inorganic compounds, such as p-Si and p-SiC, may also be used as a positive-hole injecting material and positive-hole transport material.

The positive-hole transport layer is formed through deposition of such a positive-hole transport material through a known thin film deposition procedure, such as vacuum deposition, spin coating, casting, printing procedures including inkjet printing, and LB deposition. The positive-hole transport layer may have any thickness, typically in the range of 5 nm to 5 µm, preferably 5 to 200 nm. The positive-hole transport layer may be a single-layer structure composed of one or more types of the above-mentioned materials.

(Electron Transport Layer)

The electron transport layer is composed of an electron transport material that can transport electrons. An electron injecting layer and a positive-hole blocking layer are also categorized into the electron transport layer in a broad sense. The electron transport layer may be composed of a single layer or multiple sublayers.

The electron transport material should transmit electrons injected from the cathode to the luminous layer and may be selected from known compounds, such as nitro-substituted fluorene derivatives, diphenylquinone derivatives, thiopyran dioxide derivatives, carbodiimide, fluorenylidene methane derivatives, anthraquinodimethane derivatives, anthrone derivatives, and oxadiazole derivatives. The electron transport material may also be a thiadiazole derivative, which is an oxadiazole derivative having an oxadiazole ring containing an oxygen atom replaced with a sulfur atom, or a quinoxaline derivative having a quinoxaline ring, which is known as an electron attractive group. Alternatively, the electron transport material may be a polymeric material composed of any of the materials mentioned above introduced into polymer chains or a polymeric material containing any of the materials mentioned above as the main chains of polymers. The electron transport material may also be a metal complex of a 8-quinolinol derivative, for example, tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, or bis(8-quinolinol) zinc (znq), or a metal complex having a central metal replaced with In, Mg, Cu, Ca, Sn, Ga, or Pb. Preferred examples of other electron transport materials include metal or metal-free phthalocyanines, and metal or metal-free phthalocyanines having ends replaced with alkyl groups and/or sulfonate groups. Similarly to the positive-hole injecting layer and the positive-hole transport layer, inorganic semiconductors, such as n-Si and n-SiC, may also be used as the electron transport material.

The electron transport layer is formed by deposition of such an electron transport material through a known thin film deposition process, such as vacuum deposition, spin coating, casting, printing procedures including inkjet printing, and LB deposition. The electron transport layer may have any thickness, typically in the range of approximately 5 nm to 5 v, preferably 5 to 200 nm. The electron transport layer may have a single-layer structure composed of one or more of the above-mentioned materials.

A method for manufacturing an organic EL element 7 will now be described.

A method for manufacturing an organic EL element 7 having the following layer configuration will now be described: anode/positive-hole injecting layer/positive-hole transport layer/luminous layer/electron transport layer/electron injecting layer/cathode.

An anode is formed into a thickness in the range of 1 µm or less, preferably 10 to 200 nm on the gas barrier film 1a according to the present invention through vapor deposition, sputtering, or plasma enhanced CVD of a predetermined electrode material, such as an anode material.

Organic compound thin films composed of organic EL element materials, i.e., a positive-hole injecting layer, a positive-hole transport layer, a luminous layer, an electron transport layer, and an electron injecting layer are formed on the anode. The organic compound thin films may be formed through a vapor deposition or wet process (spin coating, casting, inject printing, or other printing processes). Vacuum deposition, spin coating, inkjet printing, or other printing processes are preferred because they readily form a homogeneous layer and barely form pinholes. Different deposition processes may be employed for different layers. Preferred deposition conditions for vapor deposition depend on the type of the compound and generally include a boat heating temperature in the range of 50° C. to 450° C., a vacuum level in the range of $10^{-6}$ to $10^{-2}$ Pa, a vapor deposition rate in the range of 0.01 to 50 nm/sec, a substrate temperature in the range of −50° C. to 300° C., and a thickness in the range of 0.1 nm to 5 µm, preferably 5 to 200 nm.

After the formation of these layers, a cathode composed of a cathode material is formed into a thickness of 1 µm or less, preferably in the range of 50 to 200 nm, through a procedure, for example, vapor deposition or sputtering. A desirable organic EL element is thus produced.

Such an organic EL element 7 is preferably produced in a single vacuuming operation in sequence from the anode and the positive-hole injecting layer to the cathode. Alternatively, the sequence may be interrupted by the removal of the deposited layers from the vacuum and continued in a different deposition process. Such an operation should be carried out under a dry inert gas atmosphere. The order of deposition of the layers may be reversed to deposit the layers in the following order: cathode, electron injecting layer, electron transport layer, luminous layer, positive-hole transport layer, positive-hole injecting layer, and anode.

An organic EL panel P including the resulting organic EL element 7 emits light in response to the application of a DC voltage in the range of approximately 2 to 40 V across the anode (positive polarity) and the cathode (negative polarity). Alternatively, an AC voltage may be applied. The AC voltage may have any AC waveform.

The organic EL element described above is of a surface emission type and can be used as a light source. Examples of such light sources include lighting systems for houses and vehicles; backlights for clocks and liquid crystal displays; lighting for billboards; and light sources for traffic lights, optical memory media, electrophotographic copiers, optical communication processors, and optical sensors. The organic EL element can be applied to any other use and may efficiently be used as a backlight for a liquid crystal display in combination with a color filter or as a light source for illumination.

EXAMPLES

Detailed examples of the present invention will now be described. These examples, however, should not be construed to limit the present invention. The term "part" and the sign "%" used in the examples respectively refer to "part by mass" and "mass %," unless otherwise specified.

The evaluation process will now be described.
[Evaluation of Water Vapor Barrier Rate]

Water vapor permeability of the gas barrier film according to the present invention was measured through a Ca corrosion test under Conditions (1) and (2).
(Preparation of Evaluation Cell for Water Vapor Barrier Rate)

A vacuum deposition apparatus JEE-400 (manufactured by JEOL, Ltd.) was used to deposit metal calcium through a mask onto nine 12×12-mm areas on the surface of a sample of a gas barrier film. The mask was removed under the vacuum, and aluminum was deposited with another metal deposition source onto the entire surface of one side the layer. After the aluminum sealing, the vacuum was released and a dry nitrogen atmosphere was quickly introduced, a 0.2-mm thick quartz glass was disposed so as to face the aluminum deposited surface with UV-curable resin for sealing (manufactured by Nagase Chemtex Co.) disposed therebetween, and the resin was irradiated with ultraviolet rays to form an evaluation cell.

The samples having sealed surfaces were stored in (1) an environment of 40° C. and 20% RH and (2) an environment of a high temperature of 60° C. and a high humidity of 90% RH, and the amount of water permeating through the cells was calculated from the amount of corrosion in the metal calcium in accordance with the procedure described in Japanese Patent Application Laid-Open Publication No. 2005-283561 (each sample was measured under both Conditions (1) and (2)).

In order to confirm that no water vapor is permeated through areas other than the gas barrier film, a comparative sample was prepared instead of the gas barrier film sample. The comparative sample was a 0.2-mm thick quartz glass plate on which metal calcium was deposited. The comparative sample was also stored at a high temperature of 60° C. and a high humidity of 90% RH. It was confirmed that no corrosion of metal calcium was generated after 1000 hours.

The amount of permeated water of each gas barrier film was thereby determined.
(Apparatus and Material Used)

Deposition apparatus: vacuum deposition apparatus JEE-400 manufactured by JEOL, Ltd.

Thermo-hygrostat oven: Yamato Humidic Chamber IG47M

Corrosive metal by reaction with water: calcium (granules)

Metal impermeable to water vapor: aluminum (granules having a diameter of 3 to 5 mm)

[Flexure Resistance: Evaluation of Water Vapor Permeability after Bending Test]

Each gas barrier film was repeatedly bent 100 times at the angle of 180 degrees with a radius of curvature being 10 mm, the amount of permeated water was measured as described above, and the level of deterioration resistance was calculated by the following expression on the basis of a change in the amount of permeated water before and after the bending test, to determine the flexure resistance in accordance with the criteria described below.

Level of deterioration resistance=(amount of permeated water before bending test/amount of permeated water after bending test)×100%

5: 90%≤level of deterioration resistance
4: 80%≤level of deterioration resistance<90%
3: 60%≤level of deterioration resistance<80%
2: 30%≤level of deterioration resistance<60%
1: level of deterioration resistance<30%
[Evaluation of Cracking]

The samples of the gas barrier film were alternately disposed 30 times in an environment of 23±2° C. and 55±5% RH for 12 hours and an environment of 85±3° C. and 90±2% RH for 12 hours, and finally left in the environment of 23±2° C. and 55±5% RH for 12 hours. The cracks in the samples were then examined with an optical microscope and evaluated in accordance with the following ranks:

A: Very few cracks
B: Some small cracks
C: Many small cracks over the entire surface
D: Numerous cracks over the entire surface
Ranks C and D are unsuitable for use.

Example 1

(Substrate)

The substrate was composed of a biaxially stretched poly(ethylene naphthalate) (PEN) film having a thickness of 100 μm and a width of 350 mm ("Teonex Q65FA" (product name) manufactured by Teijin DuPont Films Japan Ltd.).
(Preparation of Gas Barrier Layer)

The substrate was loaded in the apparatus illustrated in FIG. 2 and a gas barrier layer having a thickness of 300 nm was formed on the substrate under the following deposition conditions (conditions for plasma enhanced CVD). As illustrated in FIG. 3, the gas inlet was shifted by 2%, 5%, 10%, and 20% in a direction parallel to the line segment connecting the deposition roller electrodes toward the deposition roller 31 or 32 from the perpendicular bisector of the line segment connecting the deposition roller electrodes to produce samples (gas barrier film samples 1-1, 1-2, 1-3, and 1-4) having a high oxygen content at the surface, adjacent to the substrate, of the gas barrier layer as shown in Table 1. A sample of a comparative example was produced while the gas inlet was disposed on the perpendicular bisector (gas barrier film sample 1-5).
(Deposition Conditions)

Material gas (HMDSO) supply: 50 sccm (standard cubic centimeter per minute)

Oxygen gas ($O_2$) supply: 500 sccm

Vacuum level in vacuum chamber: 3 Pa

Electrical power applied by power source for plasma generation: 0.8 kW

Frequency of power source for plasma generation: 70 kHz

Conveying rate of film: 0.8 m/min

The resulting samples were subjected to XPS depth profiling under the conditions listed below to determine the distributions of silicon atoms, oxygen atoms, and carbon atoms.

<XPS Depth Profiling>

Etching ion: argon (Ar$^+$)

Etching rate (equivalent to a value for a thermally-oxidized SiO$_2$ film): 0.05 nm/sec Etching pitch (equivalent to a value for SiO$_2$): 10 nm X-ray photoelectron spectrometer: "VG Theta Probe" (product name) manufactured by Thermo Fisher Scientific Inc.

X-ray radiation: single-crystal dispersion AlKα

X-ray spot size and shape: 800×400 μm oval

FIGS. 4, 5, and 6 illustrate the distribution curves of silicon, oxygen, and carbon of the gas barrier film samples 1-2, 1-3, and 1-5 determined on the basis of the evaluated data, where the horizontal axis represents the distance from the surface of the barrier and the vertical axis represents the proportions of the quantities of silicon, oxygen, and carbon atoms (atomic percentages of silicon, oxygen, and carbon) relative to the total quantity of silicon, oxygen, and carbon atoms.

These results evidentially show that samples 1-2 (FIGS. 4) and 1-3 (FIG. 5) of the present invention have atomic percentages of silicon, oxygen, and carbon that satisfy Condition (i), have a carbon distribution curve including obvious local extremum points, have an atomic percentage of carbon of which the absolute value of the difference between the maximum and minimum values is 5 at % or more, and satisfy Condition (iv), i.e., the value of the local extremum point of the oxygen distribution curve closest to the surface, adjacent to the substrate, of the gas barrier layer is the largest of the values of the local extremum points of the oxygen distribution curve of the gas barrier layer.

Samples 1-1, 1-2, 1-3, and 1-4 of the present invention have superior results on gas barrier properties and the bending test and the cracking test.

In contrast, comparative sample 1-5 (FIG. 6) satisfies Conditions (i) to (iii) but does not satisfy Condition (iv) because the atomic percentage of oxygen at the local extremum point of the oxygen distribution curve closest to the surface, adjacent to the substrate, of the gas barrier layer is the same as the atomic percentage of oxygen at an local extremum point of the oxygen distribution curve closest to the surface, remote from the substrate, of the gas barrier layer. Thus, the sample has inferior results on gas barrier properties, bending test, and cracking test.

TABLE 1

| GAS BARRIER FILM SAMPLE No. | POSITION OF GAS INLET | THICKNESS OF GAS BARRIER LAYER (nm) | CARBON DISTRIBUTION CURVE | | ABSOLUTE DIFFERENCE BETWEEN MAXIMUM AND MINIMUM VALUES (at %) | | RELATIONSHIP BETWEEN ATOMIC PERCENTAGES OF OXYGEN X AND Y (*) (Y/X) |
|---|---|---|---|---|---|---|---|
| | | | NUMBER OF LOCAL EXTREMUM POINTS | ABSOLUTE DIFFERENCE BETWEEN DISTANCES OF LOCAL MAXIMUM POINTS (nm) | ATOMIC PERCENTAGE OF CARBON | ATOMIC PERCENTAGE OF SILICON | |
| 1-1 | 2% MOVEMENT TOWARD DEPOSITION ROLLER 31 | 300 | 5 | 130 | 10 | 2 | 1.03 |
| 1-2 | 5% MOVEMENT TOWARD DEPOSITION ROLLER 31 | 300 | 5 | 130 | 10 | 2 | 1.06 |
| 1-3 | 10% MOVEMENT TOWARD DEPOSITION ROLLER 32 | 300 | 5 | 130 | 15 | 2 | 1.14 |
| 1-4 | 20% MOVEMENT TOWARD DEPOSITION ROLLER 32 | 300 | 5 | 130 | 16 | 2 | 1.20 |
| 1-5 | NO MOVEMENT (MIDDLE BETWEEN DEPOSITION ROLLERS) | 300 | 5 | 130 | 10 | 3 | 1.00 |

| GAS BARRIER FILM SAMPLE No. | WATER VAPOR BARRIER RATE (g/m$^2$ · 24 h) | | FLEXURE RESISTANCE | CRACKING | NOTE |
|---|---|---|---|---|---|
| | CONDITION (1) | CONDITION (2) | | | |
| 1-1 | 3.0 × 10$^{-4}$ | 4.0 × 10$^{-4}$ | 3 | B | INVENTIVE |
| 1-2 | 1.0 × 10$^{-4}$ | 1.0 × 10$^{-4}$ | 3 | B | INVENTIVE |
| 1-3 | 5.0 × 10$^{-5}$ | 5.0 × 10$^{-5}$ | 4 | B | INVENTIVE |
| 1-4 | 4.0 × 10$^{-5}$ | 4.0 × 10$^{-5}$ | 4 | B | INVENTIVE |
| 1-5 | 7.0 × 10$^{-4}$ | 3.0 × 10$^{-3}$ | 2 | C | COMPARATIVE |

X: VALUE OF LOCAL MAXIMUM POINT CLOSEST TO SURFACE OF GAS BARRIER LAYER REMOTE FROM SUBSTRATE
Y: VALUE OF LOCAL MAXIMUM POINT CLOSEST TO SURFACE OF GAS BARRIER LAYER ADJACENT TO SUBSTRATE

Example 2

Figure 8:
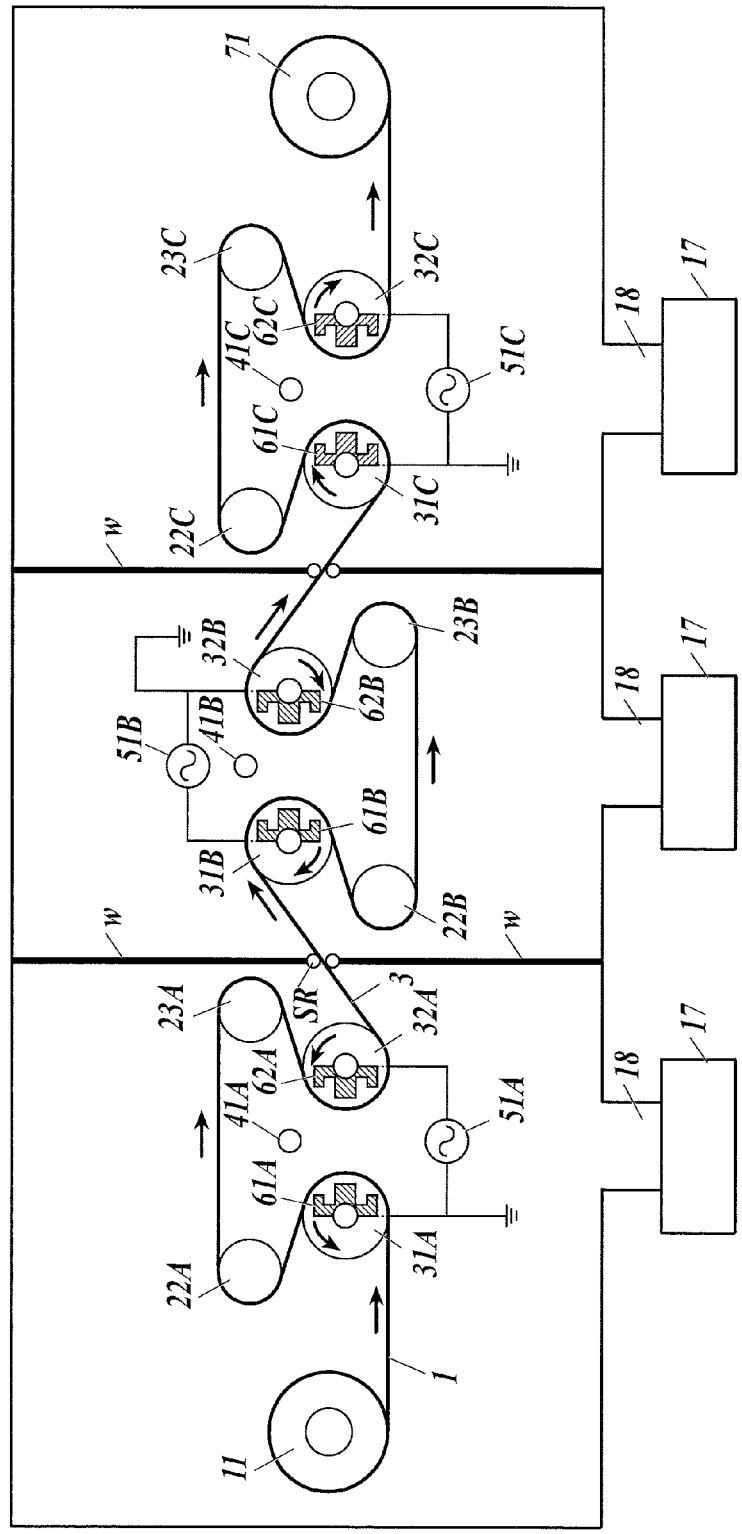
FIG. 8 is a schematic view of the outline of an example tandem apparatus for manufacturing a gas barrier film.

With reference to FIG. 8, a tandem plasma enhanced CVD system was constructed by connecting two or three devices illustrated in FIG. 2.

The plasma enhanced CVD system was used to perform CVD two times and three times so as to prepare samples of gas barrier films including gas barrier layers having thickness of 600 nm and 900 nm while the gas inlet was positioned at the same position as that during the preparation of the samples 1-1, 1-2, 1-3, and 1-4 in Example 1 under the same conditions as those for the preparation of the gas barrier layers of Example 1.

Similarly to Example 1, XPS depth profiling was performed on the resulting samples to determine the silicon, oxygen, and carbon distribution curves. The samples 2-1, 2-2, 3-1, and 3-2 of the present invention have atomic percentages of silicon, oxygen, and carbon that satisfy Condition (i), have a carbon distribution curve including obvious local extremum points, have an atomic percentage of carbon of which the absolute value of the difference between the maximum and minimum values is 5 at % or more, and satisfy Condition (iv). Thus, the gas barrier properties and the results of the bending test and cracking test are superior.

In contrast, comparative samples 2-3 and 3-3 satisfy Conditions (i) to (iii) but do not satisfy Condition (iv). Thus, the gas barrier properties and the results of the bending test and cracking test are inferior.

(Preparation of Primary Layer)

A UV-curable organic-inorganic hybrid hard coating material OPSTAR Z7501 manufactured by JSR Corporation was applied with a wire bar to an adhesive surface of the substrate into a dry thickness of 4 μm, the coating material was dried at 80° C. for three minutes, and the coating material was cured by irradiation with light having an irradiation energy of 1.0 J/cm$^2$ from a high-pressure mercury lamp in air, to form the primary layer. The maximum cross-section height Rt(p) of the roughness curve representing the surface roughness was 16 nm. The roughness curve was determined through a cross-section curve representing the roughness continuously measured with an atomic force microscope (AFM) (manufactured by Digital Instruments Inc.) equipped with a detector including a probe having a very small tip radius, and through the calculation of the average roughness involving the amplitude of the microasperity measured multiple times by the probe in 30-μm sections along the measurement direction.

(Preparation of Gas Barrier Layer)

A substrate with a primary layer described above was loaded in the device illustrated in FIG. 2, and a gas barrier layer of a thickness of 300 nm was deposited on the primary layer on the substrate under the same conditions as those for the sample 1-2 of Example 1, to prepare a gas barrier film 4-1.

TABLE 2

| GAS BARRIER FILM SAMPLE No. | POSITION OF GAS INLET | THICKNESS OF GAS BARRIER LAYER (nm) | RELATIONSHIP BETWEEN ATOMIC PERCENTAGES OF OXYGEN X AND Y (*) (Y/X) | WATER VAPOR BARRIER RATE (g/m$^2$ · 24 h) CONDITION (1) | WATER VAPOR BARRIER RATE (g/m$^2$ · 24 h) CONDITION (2) |
|---|---|---|---|---|---|
| 2-1 | 5% MOVEMENT TOWARD DEPOSITION ROLLER 31 | 600 | 1.06 | $7.0 \times 10^{-5}$ | $7.0 \times 10^{-5}$ |
| 2-2 | 10% MOVEMENT TOWARD DEPOSITION ROLLER 32 | 600 | 1.14 | $3.0 \times 10^{-5}$ | $3.0 \times 10^{-5}$ |
| 2-3 | NO MOVEMENT (MIDDLE BETWEEN DEPOSITION ROLLERS) | 600 | 1.00 | $6.0 \times 10^{-3}$ | $2.0 \times 10^{-3}$ |
| 3-1 | 5% MOVEMENT TOWARD DEPOSITION ROLLER 31 | 900 | 1.06 | $6.0 \times 10^{-5}$ | $6.0 \times 10^{-5}$ |
| 3-2 | 10% MOVEMENT TOWARD DEPOSITION ROLLER 32 | 900 | 1.14 | $1.0 \times 10^{-5}$ | $1.0 \times 10^{-5}$ |
| 3-3 | NO MOVEMENT (MIDDLE BETWEEN DEPOSITION ROLLERS) | 900 | 1.00 | $9.0 \times 10^{-4}$ | $1.0 \times 10^{-3}$ |

| GAS BARRIER FILM SAMPLE No. | FLEXURE RESISTANCE | CRACKING | NOTE |
|---|---|---|---|
| 2-1 | 3 | B | INVENTIVE |
| 2-2 | 4 | B | INVENTIVE |
| 2-3 | 2 | C | COMPARATIVE |
| 3-1 | 3 | B | INVENTIVE |
| 3-2 | 4 | B | INVENTIVE |
| 3-3 | 2 | C | COMPARATIVE |

X: VALUE OF LOCAL MAXIMUM POINT CLOSEST TO SURFACE OF GAS BARRIER LAYER REMOTE FROM SUBSTRATE
Y: VALUE OF LOCAL MAXIMUM POINT CLOSEST TO SURFACE OF GAS BARRIER LAYER ADJACENT TO SUBSTRATE

Example 3

(Substrate)

A substrate was composed of a biaxially stretched poly (ethylene naphthalate) (PEN) film having a thickness of 100 μm and a width of 350 mm ("Teonex Q65FA" (product name) manufactured by Teijin DuPont Films Japan Ltd.).

XPS depth profiling was performed on the resulting sample to determine the silicon, oxygen, and carbon distribution curves. The sample 4-1 of the present invention was confirmed to satisfy Conditions (i) to (iv). Thus, the gas barrier properties and the results of the bending test and cracking test are superior.

TABLE 3

| GAS BARRIER FILM SAMPLE No. | POSITION OF GAS INLET | THICKNESS OF PRIMARY LAYER (μm) | THICKNESS OF GAS BARRIER LAYER (nm) | RELATIONSHIP BETWEEN ATOMIC PERCENTAGES OF OXYGEN X AND Y (*) (Y/X) | WATER VAPOR BARRIER RATE (g/m² · 24 h) CONDITION (1) | WATER VAPOR BARRIER RATE (g/m² · 24 h) CONDITION (2) |
|---|---|---|---|---|---|---|
| 4-1 | 5% MOVEMENT TOWARD DEPOSITION ROLLER 31 | 4 | 300 | 1.06 | $6.0 \times 10^{-5}$ | $7.0 \times 10^{-5}$ |

| GAS BARRIER FILM SAMPLE No. | FLEXURE RESISTANCE | CRACKING | NOTE |
|---|---|---|---|
| 4-1 | 4 | A | INVENTIVE |

X: VALUE OF LOCAL MAXIMUM POINT CLOSEST TO SURFACE OF GAS BARRIER LAYER REMOTE FROM SUBSTRATE
Y: VALUE OF LOCAL MAXIMUM POINT CLOSEST TO SURFACE OF GAS BARRIER LAYER ADJACENT TO SUBSTRATE

Example 4

The samples 1-2, 2-1, 3-1, and 4-1 of the present invention prepared in Examples 1 to 3 were used to form a second gas barrier layer containing polysilazane on the gas barrier layer.

(Formation of Silicon Oxide Film from Polysilazane)

A solution of 10 mass % perhydropolysilazane (uncatalyzed Aquamica NN120-10 manufactured by AZ Electronic Materials) in dibutyl ether was prepared as a coating solution.

(Formation of Polysilazane Layer)

The coating solution for a polysilazane layer was applied with a wire bar into an (average) dry thickness of 300 nm, the coating material was dried at a temperature of 85° C. and a humidity of 55% RH for one minute, and the coating material was dehumidified at a temperature of 25° C. and a humidity of 10% RH (dew-point temperature of −8° C.) for ten minutes, to form a polysilazane layer.

(Formation of Gas Barrier Layer: Silica Conversion of Polysilazane Layer by Ultraviolet Rays)

An ultraviolet irradiation apparatus was installed in the vacuum chamber, and the pressure in the vacuum chamber was adjusted to 3 Pa to perform silica conversion to the resulting polysilazane layer.

(Ultraviolet Irradiation Apparatus)

Apparatus: Excimer irradiation apparatus MECL-M-1-200 manufactured by M. D. COM. Inc.
Irradiation wavelength: 172 nm
Gas in Lamp: Xe (Modification Conditions)

A substrate with a polysilazane layer was fixed onto a movable stage and was modified under the conditions listed below, to form a gas barrier layer.
Light intensity of excimer lamp: 130 mW/cm² (172 nm)
Distance between sample and light source: 1 mm
Heating temperature of stage: 70° C.
Oxygen content in irradiation apparatus: 1.0%
Irradiation time of excimer lamp: 5 seconds The resulting samples had gas barrier properties superior to the samples prepared in Examples 1 to 3.

TABLE 4

| GAS BARRIER FILM SAMPLE No. | POSITION OF GAS INLET | THICKNESS OF PRIMARY LAYER (μm) | THICKNESS OF GAS BARRIER LAYER (nm) | THICKNESS OF POLYSILAZANE LAYER (nm) | RELATIONSHIP BETWEEN ATOMIC PERCENTAGES OF OXYGEN X AND Y (*) (Y/X) | WATER VAPOR BARRIER RATE (g/m² · 24 h) CONDITION (1) | WATER VAPOR BARRIER RATE (g/m² · 24 h) CONDITION (2) |
|---|---|---|---|---|---|---|---|
| 5-1 | 5% MOVEMENT TOWARD DEPOSITION ROLLER 31 | — | 300 | 300 | 1.06 | $8.6 \times 10^{-6}$ | $9.0 \times 10^{-6}$ |
| 5-2 | 5% MOVEMENT TOWARD DEPOSITION ROLLER 31 | — | 600 | 300 | 1.06 | $4.6 \times 10^{-6}$ | $8.0 \times 10^{-6}$ |
| 5-3 | 5% MOVEMENT TOWARD DEPOSITION ROLLER 31 | — | 900 | 300 | 1.06 | $2.5 \times 10^{-6}$ | $6.0 \times 10^{-6}$ |
| 5-4 | 5% MOVEMENT TOWARD DEPOSITION ROLLER 31 | 4 | 300 | 300 | 1.06 | $1.5 \times 10^{-6}$ | $2.0 \times 10^{-6}$ |

TABLE 4-continued

| | GAS BARRIER FILM SAMPLE No. | FLEXURE RESISTANCE | CRACKING | NOTE |
|---|---|---|---|---|
| | 5-1 | 4 | A | INVENTIVE |
| | 5-2 | 4 | A | INVENTIVE |
| | 5-3 | 4 | A | INVENTIVE |
| | 5-4 | 5 | A | INVENTIVE |

X: VALUE OF LOCAL MAXIMUM POINT CLOSEST TO SURFACE OF GAS BARRIER LAYER REMOTE FROM SUBSTRATE
Y: VALUE OF LOCAL MAXIMUM POINT CLOSEST TO SURFACE OF GAS BARRIER LAYER ADJACENT TO SUBSTRATE

INDUSTRIAL APPLICABILITY

The gas barrier film according to the present invention has satisfactory gas barrier properties, can be bent without degradation of the gas barrier properties, and has high crack resistance even under a high-temperature and high-humidity environment. Thus, the gas barrier film can be suitably used for gas blocking in electronic devices, such as liquid crystal displays, organic electroluminescence elements, photovoltaic cells, or electronic paper.

The invention claimed is:

1. A gas barrier film comprising a gas barrier layer on at least one surface of a substrate, the gas barrier layer containing silicon, oxygen, and carbon, wherein
distribution curves of silicon, oxygen, and carbon obtained through element distribution measurement for the gas barrier layer in a depth direction using X-ray photoelectron spectroscopy satisfy all of following conditions (i) to (iv):
(i) atomic percentages of silicon, oxygen, and carbon have a following relationship in an area covering 90% or more of a distance from a surface of the gas barrier layer across a thickness;

(atomic percentage of carbon)<(atomic percentage of silicon)<(atomic percentage of oxygen);

(ii) the carbon distribution curve has at least two local extremum points;
(iii) an absolute value of a difference between a maximum value and a minimum value of the atomic percentage of carbon on the carbon distribution curve is 5 at % or more; and
(iv) on the oxygen distribution curve, a value of a local maximum point of the oxygen distribution curve closest to the surface, adjacent to the substrate, of the gas barrier layer is largest of values of local maximum points of the oxygen distribution curve of the gas barrier layer; and
wherein the atomic percentage of oxygen at the local maximum point of the oxygen distribution curve closest to the surface, adjacent to the substrate, of the gas barrier layer is 1.05 times or more the atomic percentage of oxygen at a local maximum point of the oxygen distribution curve closest to the surface, remote from the substrate, of the gas barrier layer.

2. The gas barrier film according to claim 1, wherein an absolute value of a difference between a maximum value and a minimum value of the atomic percentage of silicon on the silicon distribution curve is less than 5 at %.

3. The gas barrier film according to claim 1, wherein an absolute value of a difference between distances of adjacent local maximum points of the carbon distribution curve is 200 nm or less.

4. The gas barrier film according to claim 1, wherein the carbon distribution curve has at least three local extremum points.

5. The gas barrier film according claim 1, further comprising a primary layer disposed between the substrate and the gas barrier layer, the primary layer comprising a polymer containing carbon.

6. A method for manufacturing a gas barrier film, the method comprising forming the gas barrier layer of the gas barrier film according to claim 1 on the substrate through plasma enhanced chemical vapor deposition.

7. The method for manufacturing a gas barrier film according to claim 6, wherein the substrate comprises a flexible strip, the substrate is conveyed while the substrate is in contact with a pair of deposition rollers, the plasma enhanced chemical vapor deposition involving plasma discharge is performed while deposition gas is supplied between the deposition rollers, and thereby the gas barrier layer is formed on the substrate.

8. The method for manufacturing a gas barrier film according to claim 7, wherein the deposition gas comprises an organosilicon compound and oxygen.

9. The method for manufacturing a gas barrier film according to claim 8, wherein the deposition gas comprises oxygen in an amount equal to or less than a theoretical amount of oxygen required for complete oxidation of all the organosilicon compound when the deposition gas is supplied.

* * * * *